(12) United States Patent
Itano et al.

(10) Patent No.: US 11,653,121 B2
(45) Date of Patent: May 16, 2023

(54) PHOTOELECTRIC CONVERSION APPARATUS, A/D CONVERTER, AND EQUIPMENT

(71) Applicant: CANON KABUSHIKI KAISHA, Tokyo (JP)

(72) Inventors: Tetsuya Itano, Kanagawa (JP); Kohichi Nakamura, Kanagawa (JP); Daisuke Kobayashi, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/590,007

(22) Filed: Feb. 1, 2022

(65) Prior Publication Data

US 2022/0247957 A1     Aug. 4, 2022

(30) Foreign Application Priority Data

Feb. 4, 2021  (JP) ............................. JP2021-016895
Feb. 4, 2021  (JP) ............................. JP2021-016896

(51) Int. Cl.
*H04N 5/378*     (2011.01)
*H03M 3/00*      (2006.01)
*H04N 5/343*     (2011.01)

(52) U.S. Cl.
CPC .............. *H04N 5/378* (2013.01); *H03M 3/30* (2013.01); *H03M 3/494* (2013.01); *H04N 5/343* (2013.01)

(58) Field of Classification Search
CPC .......... H04N 5/30; H04N 5/341; H04N 5/343; H04N 5/37455; H04N 5/378; H03M 3/30; H03M 3/458; H03M 3/462; H03M 3/494
See application file for complete search history.

(56) References Cited

U.S. PATENT DOCUMENTS 7,825,974 B2   11/2010   Itano et al.
8,085,319 B2   12/2011   Ono et al.
(Continued)

FOREIGN PATENT DOCUMENTS

JP   2006-108892 A   4/2006
JP   2009-033381 A   2/2009
(Continued)

OTHER PUBLICATIONS

U.S. Appl. No. 17/590,887, filed Feb. 2, 2022 (First Named Inventor: Kohichi Nakamura).
(Continued)

*Primary Examiner* — Lin Ye
*Assistant Examiner* — Chriss S Yoder, III
(74) *Attorney, Agent, or Firm* — Venable LLP

(57) ABSTRACT

A photoelectric conversion apparatus includes a light receiving circuit configured to convert light into an electrical signal, a readout circuit configured to read out an analog signal corresponding to the electrical signal, a $\Delta\Sigma$ A/D converter configured to convert the analog signal into a digital signal, and a control circuit configured to change a gain of the photoelectric conversion apparatus in accordance with a change of a driving mode of the photoelectric conversion apparatus. The analog signal read out by the readout circuit is an analog current signal. The readout circuit includes a variable resistor on a signal path for supplying the analog current signal to the $\Delta\Sigma$ A/D converter. The control circuit changes the gain of the photoelectric conversion apparatus by changing a resistance value of the variable resistor.

34 Claims, 11 Drawing Sheets

(56) References Cited

U.S. PATENT DOCUMENTS

| | | |
|---|---|---|
| 8,400,546 B2 | 3/2013 | Itano et al. |
| 8,598,901 B2 | 12/2013 | Hiyama et al. |
| 8,711,259 B2 | 4/2014 | Maehashi et al. |
| 8,836,838 B2 | 9/2014 | Nakamura et al. |
| 8,928,786 B2 | 1/2015 | Iwata et al. |
| 9,029,752 B2 | 5/2015 | Saito et al. |
| 9,083,906 B2 | 7/2015 | Nakamura et al. |
| 9,142,575 B2 | 9/2015 | Kobayashi et al. |
| 9,288,415 B2 | 3/2016 | Yamazaki et al. |
| 9,602,753 B2 | 3/2017 | Saito et al. |
| 10,504,949 B2 | 12/2019 | Kobayashi et al. |
| 2006/0071835 A1 | 4/2006 | Inukai |
| 2009/0027533 A1 | 1/2009 | Itakura et al. |
| 2014/0160332 A1* | 6/2014 | Sumi ............... H04N 5/379 348/308 |
| 2014/0293103 A1 | 10/2014 | Wakabayashi et al. |
| 2020/0059242 A1* | 2/2020 | Moue ............... H03M 3/462 |
| 2020/0336686 A1* | 10/2020 | Hosaka ............ H03M 1/123 |
| 2021/0021782 A1 | 1/2021 | Sato et al. |
| 2022/0303492 A1* | 9/2022 | Itano ............... H03M 1/123 |

FOREIGN PATENT DOCUMENTS

| | | |
|---|---|---|
| JP | 2013-090234 A | 5/2013 |
| WO | 2013/058167 A1 | 4/2013 |
| WO | 2019/069614 A1 | 4/2019 |

OTHER PUBLICATIONS

U.S. Appl. No. 17/590,895, filed Feb. 2, 2022 (First Named Inventor: Kazuhiro Saito).

U.S. Appl. No. 17/591,043, filed Feb. 2, 2022 (First Named Inventor: Daisuke Kobayashi).

U.S. Appl. No. 17/693,597, filed Mar. 14, 2022 (First Named Inventor: Tetsuya Itano).

* cited by examiner

PHOTOELECTRIC CONVERSION APPARATUS, A/D CONVERTER, AND EQUIPMENT

BACKGROUND OF THE INVENTION

Field of the Invention

The present invention relates to a photoelectric conversion apparatus, an A/D converter, and an equipment.

Description of the Related Art

There are proposed various techniques to widen the range of an input signal in a photoelectric conversion apparatus. According to International Publication No. 2019/069614, sample-and-hold circuits that hold a noise signal and a data signal, respectively, are each formed by a plurality of capacitive elements, and the number of capacitive elements used to hold each signal is changed to change a gain.

SUMMARY OF THE INVENTION

According to some embodiments, a photoelectric conversion apparatus includes a light receiving circuit configured to convert light into an electrical signal, a readout circuit configured to read out an analog signal corresponding to the electrical signal, a ΔΣ A/D converter configured to convert the analog signal into a digital signal, and a control circuit configured to change a gain of the photoelectric conversion apparatus in accordance with a change of a driving mode of the photoelectric conversion apparatus. The analog signal read out by the readout circuit is an analog current signal. The readout circuit includes a variable resistor on a signal path for supplying the analog current signal to the ΔΣ A/D converter. The control circuit changes the gain of the photoelectric conversion apparatus by changing a resistance value of the variable resistor.

Further features of the present invention will become apparent from the following description of exemplary embodiments (with reference to the attached drawings).

DESCRIPTION OF THE EMBODIMENTS

Figure 1:
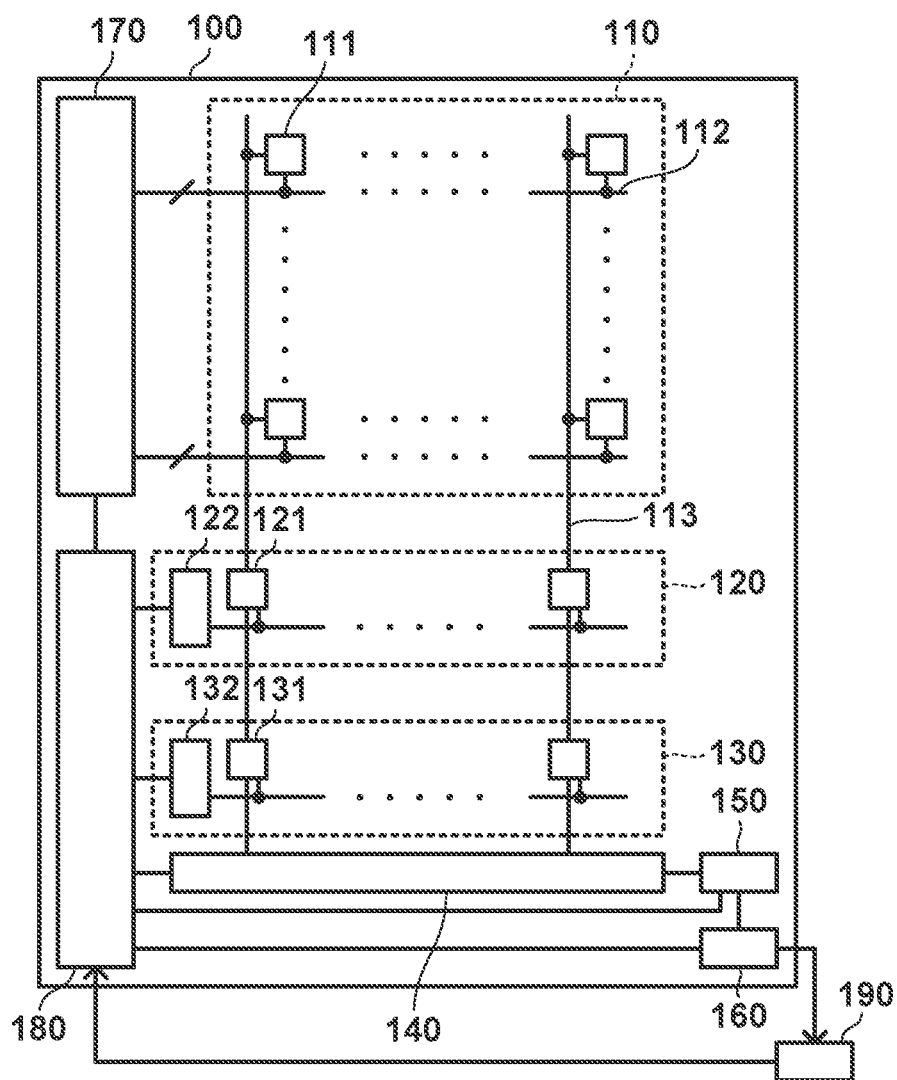
FIG. 1 is a block diagram for explaining an example of the arrangement of a photoelectric conversion apparatus 100 according to some embodiments.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

As in International Publication No. 2019/069614, an arrangement for changing a gain by changing the number of capacitive elements of a sample-and-hold circuit needs to include many capacitive elements, thereby increasing a chip size. This embodiment provides a technique for making it possible to change the gain of a photoelectric conversion apparatus while suppressing an increase in chip size.

Embodiments in which a photoelectric conversion apparatus 100 is used for image capturing will mainly be described below. In this case, the photoelectric conversion apparatus 100 can be used as an image sensor for generating an image. Furthermore, other examples of the photoelectric conversion apparatus 100 are a distance measuring element (a sensor used for distance measurement using focus detection or TOF (Time Of Flight)), a photometric element (a sensor used to measure an incident light amount or the like), and a LiDAR (Light Detection and Ranging) sensor. Embodiments to be described below are applicable to any photoelectric conversion apparatus.

An example of the arrangement of the photoelectric conversion apparatus 100 according to some embodiments will be described with reference to a block diagram shown in FIG. 1. In the example shown in FIG. 1, the photoelectric conversion apparatus 100 includes a pixel unit 110, a readout unit 120, an A/D conversion unit 130, a horizontal scanning circuit 140, a signal processing circuit 150, an output circuit 160, a vertical scanning circuit 170, and a timing control circuit 180.

The pixel unit 110 includes a plurality of pixel circuits 111 arrayed in a two-dimensional array, a plurality of driving lines 112 provided for pixel rows, respectively, and a plurality of signal lines 113 provided for pixel columns, respectively. The pixel row indicates the plurality of pixel circuits 111 arranged in the horizontal direction in FIG. 1. The pixel column indicates the plurality of pixel circuits 111 arranged in the vertical direction in FIG. 1.

The pixel circuit 111 converts incident light into an electrical signal. Therefore, the pixel circuit 111 can also be called a light receiving circuit. The vertical scanning circuit 170 supplies a control signal to each of the plurality of pixel circuits 111 via a corresponding one of the driving line 112. The readout unit 120 reads out, via a corresponding one of the signal lines 113, the electrical signal from the pixel circuit 111 supplied with the control signal of an active level.

The readout unit 120 includes a plurality of readout circuits 121 provided for the signal lines 113, respectively, and a control circuit 122 for controlling the operations of the readout circuits 121. Each readout circuit 121 reads out an analog signal corresponding to the electrical signal generated by the pixel circuit 111, and supplies it to the A/D conversion unit 130.

The A/D conversion unit 130 includes a plurality of A/D converters 131 provided for the signal lines 113, respectively, and a control circuit 132 for controlling the operations of the A/D converters 131. Each A/D converter 131 converts, into a digital signal, the analog signal supplied from the readout circuit 121. In the following description, each A/D converter 131 is a ΔΣ A/D converter.

The horizontal scanning circuit 140 sequentially reads out the digital signals from the plurality of A/D converters 131, and supplies them to the signal processing circuit 150. The photoelectric conversion apparatus 100 may include, between the A/D conversion unit 130 and the horizontal scanning circuit 140, a memory circuit for storing the digital signals. The signal processing circuit 150 processes the digital signal corresponding to the electrical signal generated in each pixel circuit 111. The signal processing circuit 150 may perform, for example, correction processing, complement processing, or the like for the digital signal.

The digital signal processed by the signal processing circuit 150 is output from the output circuit 160 to an external apparatus 190 outside the photoelectric conversion apparatus 100. The external apparatus 190 may be, for example, a control apparatus of an equipment incorporating the photoelectric conversion apparatus 100. The timing control circuit 180 controls the overall operation of the photoelectric conversion apparatus 100 by supplying a control signal to each circuit of the photoelectric conversion apparatus 100. For example, the timing control circuit 180 may change the driving mode of the photoelectric conversion apparatus 100 in accordance with an instruction from the external apparatus 190. The timing control circuit 180 changes the gain of the photoelectric conversion apparatus 100 in accordance with the change of the driving mode of the photoelectric conversion apparatus 100. A detailed example of a gain change method will be described later. The change of the driving mode may include a change between a still image capturing mode and a moving image capturing mode of shooting using the photoelectric conversion apparatus 100. The change of the driving mode may include a change of the sensitivity of shooting using the photoelectric conversion apparatus 100. The change of the driving mode may include a change of the resolution of A/D conversion by the A/D converter 131. The change of the driving mode may include a change of the frame rate of moving image capturing using the photoelectric conversion apparatus 100. The change of the driving mode may include at least one of the above examples.

Figure 2:
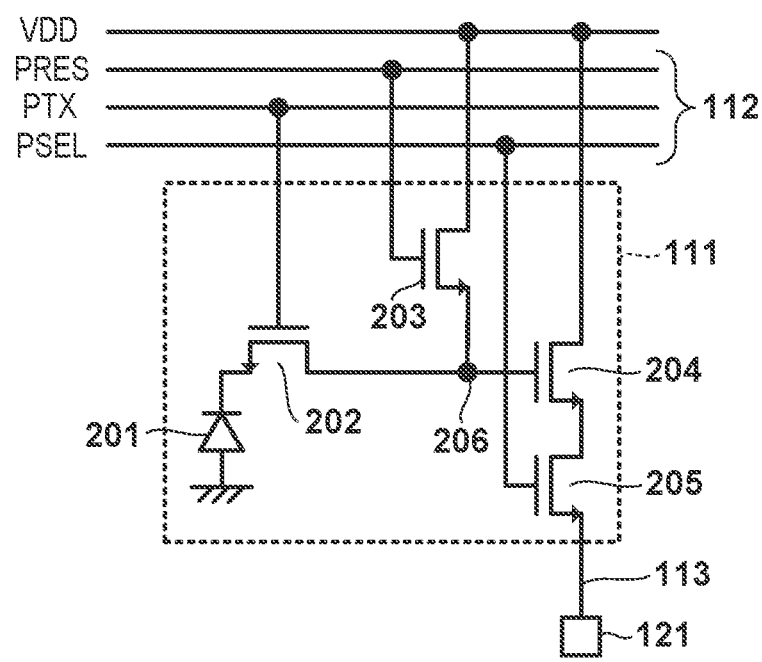
FIG. 2 is a circuit diagram for explaining an example of the circuit arrangement of a pixel circuit 111 according to some embodiments.

A detailed example of the circuit arrangement of the pixel circuit 111 will be described with reference to a circuit diagram shown in FIG. 2. The pixel circuit 111 can have an arbitrary arrangement for converting incident light into an electrical signal. An example will be described with reference to FIG. 2 but the pixel circuit 111 may have another arrangement.

In the example described with reference to FIG. 2, the pixel circuit 111 includes a photoelectric conversion element 201, a transfer transistor 202, a reset transistor 203, an amplification transistor 204, and a selection transistor 205. In the example shown in FIG. 2, the pixel unit 110 includes the three driving lines 112 for each pixel row, which supply control signals PRES, PTX, and PSEL to the pixel circuit 111, respectively.

The photoelectric conversion element 201 converts incident light into charges, and accumulates them. The photoelectric conversion element 201 may be, for example, a photodiode or a phototransistor. The photoelectric conversion element 201 may be a CMOS (Complementary Metal Oxide Semiconductor) sensor. Alternatively, the photoelectric conversion element 201 may be a SPAD (Single Photon Avalanche Diode) sensor.

The photoelectric conversion element 201 is connected to a floating diffusion 206 via the transfer transistor 202. The vertical scanning circuit 170 supplies the control signal PTX to the gate of the transfer transistor 202. When the control signal PTX is set to the active level, the transfer transistor 202 is set in a conductive state. The signal charges accumulated in the photoelectric conversion element 201 are accordingly transferred to the floating diffusion 206.

The floating diffusion 206 is also connected to the gate of the amplification transistor 204. One main electrode of the amplification transistor 204 is connected to the signal line 113 via the selection transistor 205. The other main electrode of the amplification transistor 204 is connected to a power supply potential VDD. The vertical scanning circuit 170 supplies the control signal PSEL to the gate of the selection transistor 205. When the control signal PSEL is set to the active level, the selection transistor 205 is set in the conductive state. The one main electrode of the amplification transistor 204 is accordingly connected to the current source of the readout circuit 121. This causes the amplification transistor 204 to operate as a source follower, and a signal corresponding to the potential of the floating diffusion 206 is read out into the signal line 113.

The reset transistor 203 is connected between the floating diffusion 206 and the power supply potential VDD. The vertical scanning circuit 170 supplies the control signal PRES to the gate of the reset transistor 203. When the control signal PRES is set to the active level, the reset transistor 203 is set in the conductive state. The potential of the floating diffusion 206 is accordingly reset to the power supply potential VDD.

A detailed example of the circuit arrangement of the readout circuit 121 will be described with reference to a circuit diagram shown in FIG. 3. The readout circuit 121 can have an arbitrary arrangement for reading out the electrical signal generated in the pixel circuit 111. An example will be described with reference to FIG. 3 but the readout circuit 121 may have another arrangement.

In the example described with reference to FIG. 3, the readout circuit 121 includes current sources 301, 308, and 309, sample-and-hold circuits 302 and 303, amplifiers 304 and 306, transistors 305 and 307, and a resistor 312.

The current source 301 supplies a bias current to the pixel circuit 111 (more specifically, the amplification transistor 204). Each of the sample-and-hold circuits 302 and 303 holds an output voltage from the pixel circuit 111. The timing control circuit 180 controls the pixel circuit 111 to output each of an electrical signal (to be referred to as a noise signal hereinafter) when the photoelectric conversion element 201 is in a reset state and an electrical signal (to be referred to as a data signal hereinafter) corresponding to incident light. In accordance with an instruction from the timing control circuit 180, the control circuit 122 controls the readout circuit 121 to read out the noise signal and hold it in the sample-and-hold circuit 302. Furthermore, in accordance with an instruction from the timing control circuit 180, the control circuit 122 controls the readout circuit 121 to read out the data signal from the pixel circuit 111 and hold it in the sample-and-hold circuit 303.

The amplifier 304 and the transistor 305 function as a source follower. The current source 308 supplies a bias current to the source follower. The potential of a node 310 between the current source 308 and the transistor 305 has a value corresponding to the voltage (noise signal) held in the sample-and-hold circuit 302.

The amplifier 306 and the transistor 307 function as a source follower. The current source 309 supplies a bias current to the source follower. The potential of a node 311 between the current source 309 and the transistor 307 has a value corresponding to the voltage (data signal) held in the sample-and-hold circuit 303.

The resistor 312 is connected between the nodes 310 and 311. Therefore, a voltage applied to the resistor 312 is a potential difference between the nodes 310 and 311. Thus, the readout circuit 121 supplies an analog current signal corresponding to the difference between the data signal and the noise signal to the A/D converter 131. The readout circuit 121 has a function of performing correlated double sampling (CDS).

In some embodiments, the resistor 312 may be a variable resistor. The resistor 312 is located on a signal path for supplying the analog current signal from the readout circuit 121 to the A/D converter 131. Therefore, the control circuit 122 can change the value of the analog current signal to the A/D converter 131 with respect to the same data signal by changing the resistance value of the resistor 312. More specifically, the value of the analog current signal to the A/D converter 131 with respect to the same data signal increases by decreasing the resistance value of the resistor 312, resulting in a large gain of the photoelectric conversion apparatus 100. Conversely, the value of the analog current signal to the A/D converter 131 with respect to the same data signal decreases by increasing the resistance value of the resistor 312, resulting in a small gain of the photoelectric conversion apparatus 100. In this way, the control circuit 122 can change the gain of the photoelectric conversion apparatus 100 by changing the resistance value of the resistor 312.

A detailed example of the circuit arrangement of the A/D converter 131 will be described with reference to each of block diagrams shown in FIGS. 4A and 4B. The A/D converter 131 is a $\Delta\Sigma$ A/D converter. The A/D converter 131 converts the input analog signal into a digital signal. The A/D converter 131 shown in FIG. 4A includes a first-order $\Delta\Sigma$ modulator 404 and a decimation filter 405. The A/D converter 131 shown in FIG. 4B includes a second-order $\Delta\Sigma$ modulator 407 and the decimation filter 405. Alternatively, the A/D converter 131 may include a third- or higher-order $\Delta\Sigma$ modulator. By using a high-order $\Delta\Sigma$ modulator, the noise shaping effect improves. Each of the $\Delta\Sigma$ modulators 404 and 407 converts the input analog signal into a 1-bit digital signal string. The decimation filter 405 performs decimation processing (thinning processing) for the 1-bit digital signal string.

For example, the decimation filter 405 generates a digital signal corresponding to the ratio of a time during which 1 is obtained in the 1-bit digital signal string with respect to a predetermined time length. The $\Delta\Sigma$ modulator 404 may convert the input analog signal into a digital signal string of two or more bits.

Figure 4A:
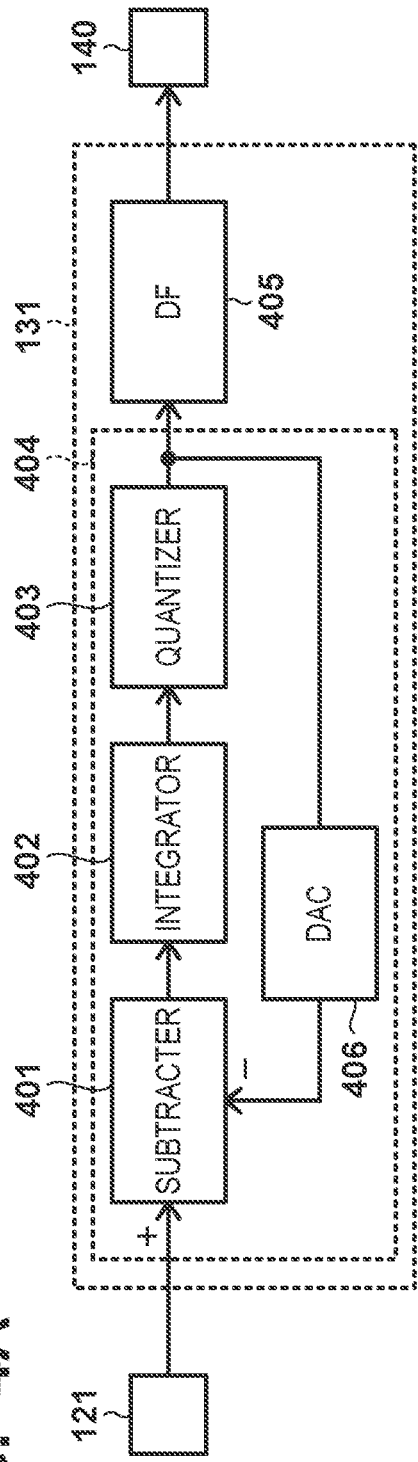
FIGS. 4A and 4B are block diagrams each for explaining an example of the circuit arrangement of an A/D converter 131 according to some embodiments.

As shown in FIG. 4A, the first-order $\Delta\Sigma$ modulator 404 includes a subtracter 401, an integrator 402, a quantizer 403, and a D/A converter (DAC) 406. An input (that is, the analog signal from the readout circuit 121) to the A/D converter 131 is supplied to the subtracter 401. Furthermore, the analog signal of the D/A converter (DAC) 406 is supplied to the subtracter 401.

The subtracter 401 supplies, to the integrator 402, the difference between the analog signal from the readout circuit 121 and that from the D/A converter 406.

The integrator 402 integrates the output from the subtracter 401. The quantizer 403 quantizes the integration result of the integrator 402. For example, the quantizer 403 generates a 1-bit digital signal string based on the integration result, and supplies it to the decimation filter 405. The output from the quantizer 403 is output from the $\Delta\Sigma$ modulator 404.

The output from the quantizer 403 is also supplied to the D/A converter 406. The D/A converter 406 generates a signal corresponding to the output from the quantizer 403, and supplies it to the subtracter 401. The signal supplied from the D/A converter 406 to the subtracter 401 is subtracted from the analog signal supplied from the readout circuit 121, as described above.

Figure 4B:
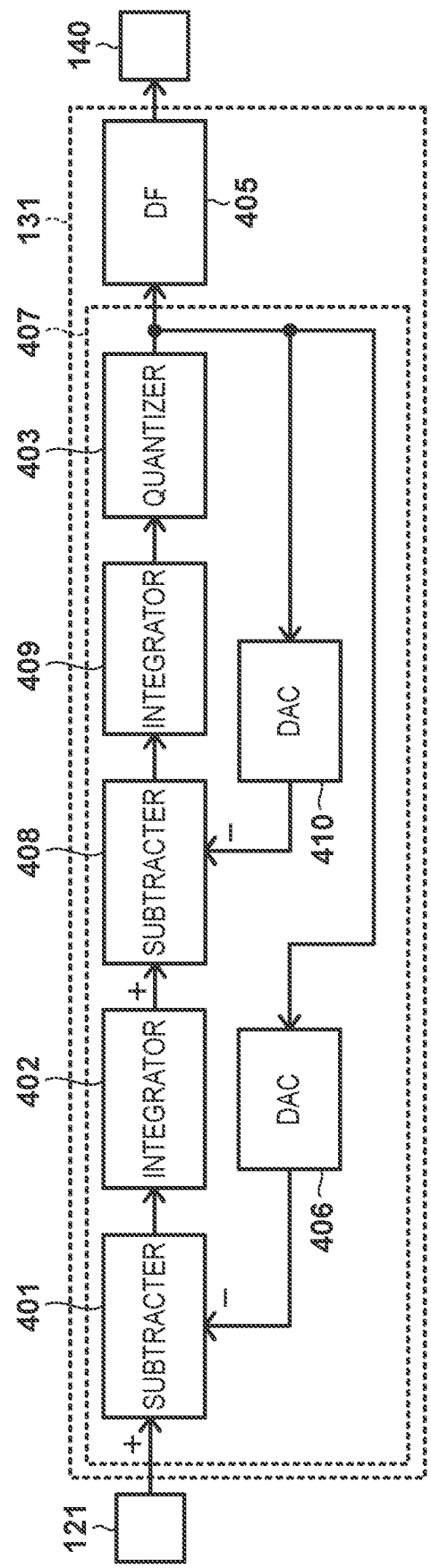

As shown in FIG. 4B, the second-order $\Delta\Sigma$ modulator 407 includes the subtracter 401, a subtracter 408, the integrator 402, an integrator 409, the quantizer 403, the D/A converter (DAC) 406, and a D/A converter (DAC) 410. The arrangements of the subtracter 401, the integrator 402, the quantizer 403, and the D/A converter (DAC) 406 are the same as those in the first-order $\Delta\Sigma$ modulator 404.

An output from the integrator 402 is supplied to the subtracter 408. Furthermore, the analog signal of the D/A converter 410 is supplied to the subtracter 408. The subtracter 408 supplies, to the integrator 409, the difference between the analog signal from the integrator 402 and that from the D/A converter 410. The integrator 409 integrates the output from the subtracter 408. The quantizer 403 quantizes the integration result of the integrator 409.

The output from the quantizer 403 is also supplied to the D/A converter 410. The D/A converter 410 generates a signal corresponding to the output from the quantizer 403, and supplies it to the subtracter 408. The signal supplied from the D/A converter 410 to the subtracter 408 is subtracted from the analog signal supplied from the integrator 402, as described above.

Figure 5A:
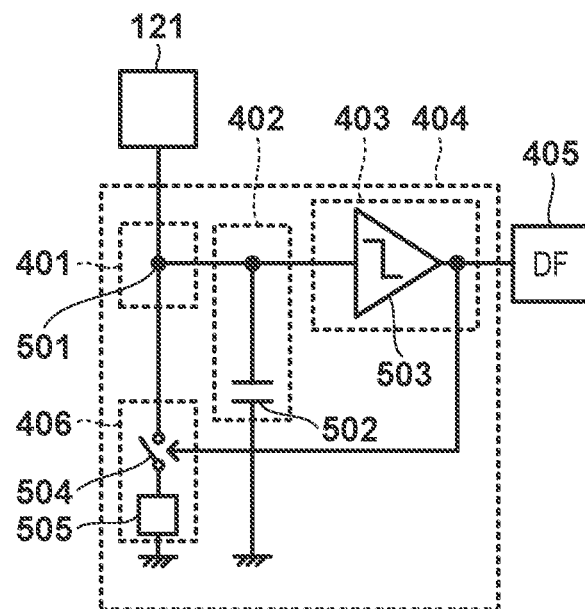
FIGS. 5A and 5B are circuit diagrams each for explaining an example of the circuit arrangement of a ΔΣ modulator according to some embodiments.
Figure 5B:
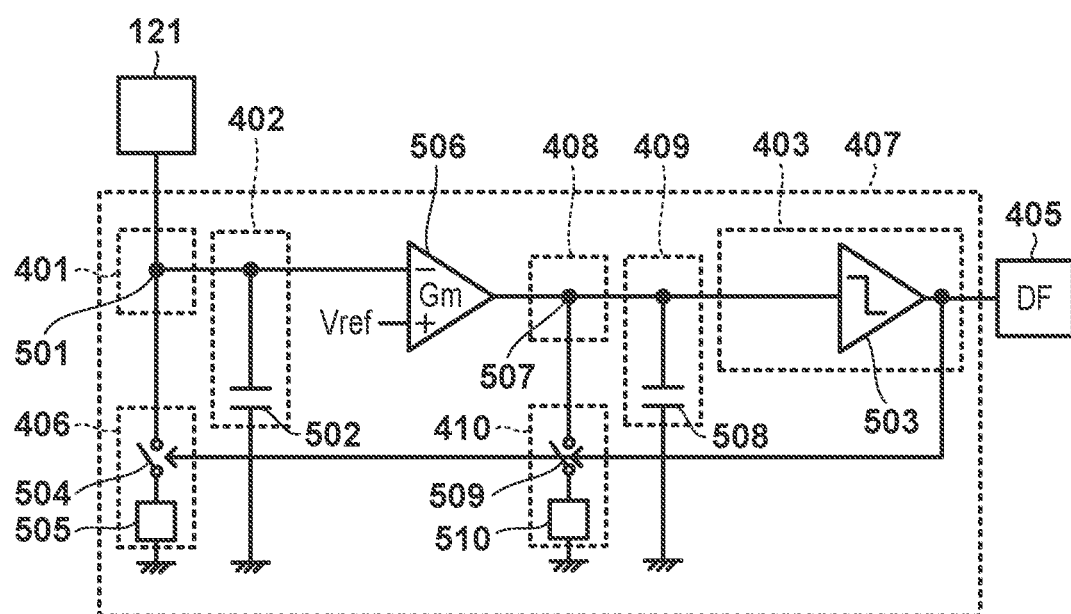

Examples of the circuit arrangements of the $\Delta\Sigma$ modulators 404 and 407 when the input to the A/D converter 131 is an analog current signal will be described with reference to FIGS. 5A and 5B, respectively. FIG. 5A shows the example of the circuit arrangement of the first-order $\Delta\Sigma$ modulator 404 and FIG. 5B shows the example of the circuit arrangement of the second-order $\Delta\Sigma$ modulator 407.

The example of the circuit arrangement of the first-order ΔΣ modulator 404 will first be described. The subtracter 401 is formed by a node 501 that is connected to the readout circuit 121, the D/A converter 406, and the integrator 402. The analog current from the D/A converter 406 is subtracted from the analog current signal supplied from the readout circuit 121 to the node 501, and the resultant current is supplied to the integrator 402.

The integrator 402 is formed by a capacitor 502. The capacitor 502 is charged with the output from the subtracter 401 so as to integrate the output. The voltage of the capacitor 502 is supplied to the quantizer 403. The quantizer 403 is formed by a comparator 503. The comparator 503 outputs a voltage of high or low level in accordance with the value of the voltage supplied from the integrator 402.

The D/A converter 406 is formed by a switch element 504 and a current generation circuit 505. The current generation circuit 505 generates an analog current to be supplied to the subtracter 401. The switch element 504 is located on a signal path between the subtracter 401 and the current generation circuit 505. ON/OFF of the switch element 504 is switched by the output from the quantizer 403. If the output from the quantizer 403 is at high level, the switch element 504 is turned on, thereby supplying the current from the current generation circuit 505 to the subtracter 401. On the other hand, if the output from the quantizer 403 is at low level, the switch element 504 is turned off, thereby supplying no current from the current generation circuit 505 to the subtracter 401. In this way, the value of the analog current supplied from the D/A converter 406 to the subtracter 401 changes in accordance with the output from the quantizer 403.

Next, the example of the circuit arrangement of the second-order ΔΣ modulator 407 will be described. The ΔΣ modulator 407 includes the subtracters 401 and 408, the integrators 402 and 409, a Gm amplifier 506, the quantizer 403, and the D/A converters 406 and 410. The circuit arrangements of the subtracter 401, the integrator 402, the quantizer 403, and the D/A converter 406 are the same as those in the first-order ΔΣ modulator 404. The Gm amplifier 506 is an amplifier, and converts an analog voltage signal supplied from the integrator 402 into an analog current signal and supplies it to the subtracter 408. The integrator 402 supplies the analog voltage signal to the inverting input terminal of the Gm amplifier 506, and the control circuit 132 supplies a reference voltage Vref to the non-inverting input terminal of the Gm amplifier 506.

The subtracter 408 is formed by a node 507 that is connected to the Gm amplifier 506, the D/A converter 410, and the integrator 409. An analog current from the D/A converter 410 is subtracted from the analog current signal supplied from the Gm amplifier 506 to the node 507, and the resultant current is supplied to the integrator 409. The integrator 409 is formed by a capacitor 508. The capacitor 508 is charged with the output from the Gm amplifier 506 so as to integrate the output. The voltage of the capacitor 508 is supplied to the quantizer 403.

The D/A converter 410 is formed by a switch element 509 and a current generation circuit 510. The current generation circuit 510 generates an analog current to be supplied to the subtracter 408. The switch element 509 is located on a signal path between the subtracter 408 and the current generation circuit 510. ON/OFF of the switch element 509 is switched by the output from the quantizer 403. If the output from the quantizer 403 is at high level, the switch element 509 is turned on, thereby supplying the current from the current generation circuit 510 to the subtracter 408. On the other hand, if the output from the quantizer 403 is at low level, the switch element 509 is turned off, thereby supplying no current from the current generation circuit 510 to the subtracter 408. In this way, the value of the analog current supplied from the D/A converter 416 to the subtracter 408 changes in accordance with the output from the quantizer 403.

Figure 6:
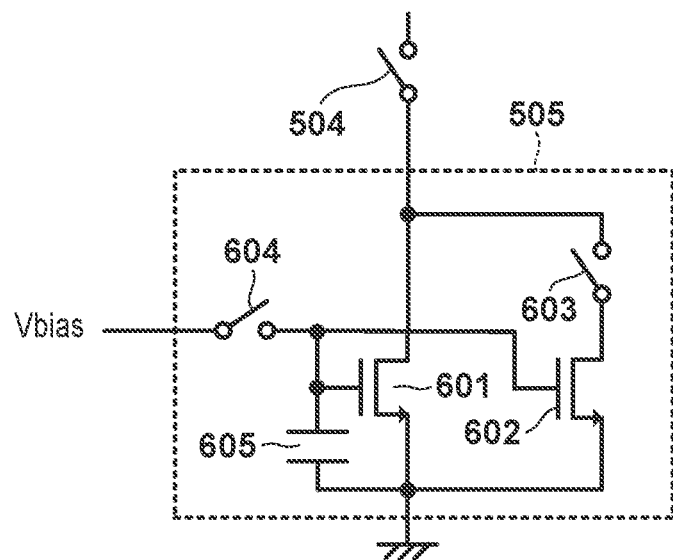
FIG. 6 is a circuit diagram for explaining an example of the circuit arrangement of a current generation circuit according to some embodiments.

A detailed example of the circuit arrangement of the current generation circuit 505 will be described with reference to a circuit diagram shown in FIG. 6. The current generation circuit 505 can have an arbitrary arrangement capable of changing a current amount to be generated. An example will be described with reference to FIG. 6 but the current generation circuit 505 may have another arrangement. The current generation circuit 510 may have the same circuit arrangement as that of the current generation circuit 505.

The current generation circuit 505 includes transistors 601 and 602, switch elements 603 and 604, and a capacitor 605. The transistor 601 is connected between the switch element 504 and ground. The transistor 602 and the switch element 603 are connected in series between the switch element 504 and ground. The control circuit 132 supplies a bias voltage Vbias to the gates of the transistors 601 and 602 via the switch element 604. The bias voltage Vbias is also supplied to the capacitor 605.

The switch element 604 and the capacitor 605 form a sample-and-hold circuit. When the switch element 604 is turned off, the bias voltage Vbias held in the capacitor 605 is supplied to the gates of the transistors 601 and 602.

Each of the transistors 601 and 602 functions as a current source that generates a current corresponding to the bias voltage Vbias supplied to the gate. The current generated by the transistor 601 is supplied to the switch element 504. The current generated by the transistor 602 is supplied to the switch element 504 when the switch element 603 is ON. The current generated by the transistor 602 is not supplied to the switch element 504 when the switch element 603 is OFF. ON/OFF of each of the switch elements 603 and 604 is controlled by a control signal supplied from the control circuit 132.

As described above, the value of the analog current supplied from the current generation circuit 505 to the switch element 504 changes in accordance with ON/OFF of the switch element 603. More specifically, when the switch element 603 is ON, a current of a larger value is supplied, as compared with a case in which the switch element 603 is OFF. By changing the value of the bias voltage Vbias, the current value generated by each of the transistors 601 and 602 can also be changed. By providing the current generation circuit 505, the D/A converter 406 can change the value of the analog current supplied from the D/A converter 406 to the subtracter 401 with respect to the same output (at high level in the above example) from the quantizer 403.

Figure 7:
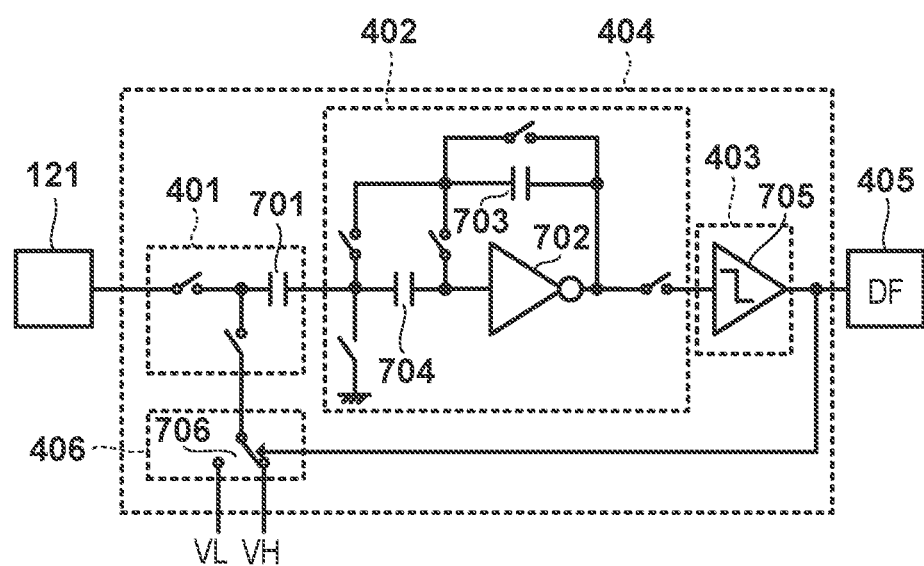
FIG. 7 is a circuit diagram for explaining another example of the circuit arrangement of the ΔΣ modulator according to some embodiments.

An example of the circuit arrangement of the first-order ΔΣ modulator 404 when the input to the A/D converter 131 is an analog voltage signal will be described with reference to FIG. 7. The subtracter 401 is formed by a capacitor 701. One terminal of the capacitor 701 is connected to the readout circuit 121 and the D/A converter 406. The other terminal of the capacitor 701 is connected to the integrator 402. An analog voltage from the D/A converter 406 is subtracted from an analog voltage signal supplied from the readout circuit 121 to the capacitor 701, and the resultant voltage is supplied to the integrator 402.

The integrator 402 is formed by an operational amplifier 702 and capacitors 703 and 704. The capacitor 703 is connected between the input and output of the operational amplifier 702. The capacitor 704 is connected between the operational amplifier 702 and the subtracter 401. The quantizer 403 is formed by a comparator 705. The comparator 705 outputs a voltage of high or low level in accordance with the value of the voltage supplied from the integrator 402.

The D/A converter 406 is formed by a switch element 706. The control circuit 132 supplies voltages VH and VL to the switch element 706. The voltage VH is higher than the voltage VL. Based on the output from the quantizer 403, the switch element 706 supplies one of the voltages VH and VL to the subtracter 401. As described above, the value of the analog voltage supplied from the D/A converter 406 to the subtracter 401 changes in accordance with the output from the quantizer 403. The control circuit 132 may supply, to the switch element 706, the voltages VH and VL supplied from the outside or generate the voltages VH and VL.

As described above, the timing control circuit 180 changes the gain of the photoelectric conversion apparatus 100 in accordance with the change of the driving mode of the photoelectric conversion apparatus 100. As described above, the timing control circuit 180 may change the gain of the photoelectric conversion apparatus 100 by changing the resistance value of the resistor 312. Instead of or in addition to this, the timing control circuit 180 may change the gain of the photoelectric conversion apparatus 100 by changing the setting of the A/D converter 131.

More specifically, when an analog current signal is supplied to the A/D converter 131, changing the setting of the A/D converter 131 may include changing the value of the analog current supplied from the D/A converter 406 to the subtracter 401 with respect to the same output from the quantizer 403. Furthermore, when the analog current signal is supplied to the A/D converter 131, changing the setting of the A/D converter 131 may include changing the value of the analog current supplied from the D/A converter 410 to the subtracter 408 with respect to the same output from the quantizer 403. The former case will be described in detail below. Changing the value of the analog current supplied from the D/A converter 406 to the subtracter 401 may include changing the number of transistors connected to the subtracter 401 or 408 among the plurality of transistors 601 and 602, as described above. Instead of or in addition to this, changing the value of the analog current supplied from the D/A converter 406 to the subtracter 401 may include changing the value of the voltage Vbias supplied to each of the gates of the transistors 601 and 602. It is possible to change the current more finely by changing the value of the voltage Vbias, as compared with a case in which the number of transistors is changed.

When the analog current signal is supplied to the A/D converter 131, changing the setting of the A/D converter 131 may include changing the value of the reference voltage Vref supplied to the Gm amplifier 506. By changing the value of the reference voltage Vref, the output from the Gm amplifier 506 changes with respect to the same output from the integrator 402. This also changes the gain of the A/D converter 131.

When the analog voltage signal is supplied to the A/D converter 131, changing the setting of the A/D converter 131 may include changing the value of the analog voltage supplied from the D/A converter 406 to the subtracter 401 with respect to the same output from the quantizer 403. When the analog voltage signal is supplied to the A/D converter 131, changing the setting of the A/D converter 131 may include changing the value of the analog voltage supplied from the D/A converter 410 to the subtracter 408 with respect to the same output from the quantizer 403. For example, the control circuit 132 may change one or both of the voltages VH and VL described with reference to FIG. 7. Since this changes the value subtracted from the input analog voltage signal with respect to the same output from the quantizer 403, the gain of the A/D converter 131 also changes.

Changing the setting of the A/D converter 131 may include changing the setting of the decimation filter 405. The setting to be changed may be, for example, the constant of the decimation filter 405 or the frequency of the clock signal of the decimation filter 405.

Any of the above-described methods of changing the gain of the photoelectric conversion apparatus 100 can suppress an increase in chip size, as compared with a case in which the number of capacitors is changed. In the above-described embodiment, the photoelectric conversion apparatus 100 includes one A/D converter 131 for each pixel column. Alternatively, the photoelectric conversion apparatus 100 may include a common A/D converter 131 for a plurality of pixel columns. In the above-described embodiment, the readout circuit 121 performs correlated double sampling. Alternatively, each of the noise signal and the data signal may be supplied to the A/D converter 131 without performing correlated double sampling in the readout circuit 121. The A/D converter 131 A/D-converts each of the noise signal and the data signal. The signal processing circuit 150 may obtain the difference between the noise signal and the data signal after A/D conversion.

Second Embodiment

International Publication No. 2019/069614 describes a technique of converting an analog current signal from a sample-and-hold circuit into a digital signal using a ΔΣ A/D (Analog-to-Digital) converter of the succeeding stage. The setting of this A/D converter cannot be changed. Therefore, if, for example, an input signal to the A/D converter is small, the inversion count of an output from the comparator of the ΔΣ converter may decrease, thereby degrading the accuracy of A/D conversion. If the setting of the A/D converter can be changed, the degree of freedom of the design of a photoelectric conversion apparatus is improved. A technique to be described below is related to a technique of making it possible to change the setting of the ΔΣ A/D converter for converting an analog current signal into a digital signal.

Embodiments in which a photoelectric conversion apparatus 100 is used for image capturing will mainly be described below. In this case, the photoelectric conversion apparatus 100 can be used as an image sensor for generating an image. Furthermore, other examples of the photoelectric conversion apparatus 100 are a distance measuring element (a sensor used for distance measurement using focus detection or TOF (Time Of Flight)), a photometric element (a sensor used to measure an incident light amount or the like), and a LiDAR (Light Detection and Ranging) sensor. Embodiments to be described below are applicable to any photoelectric conversion apparatus.

Figure 8:
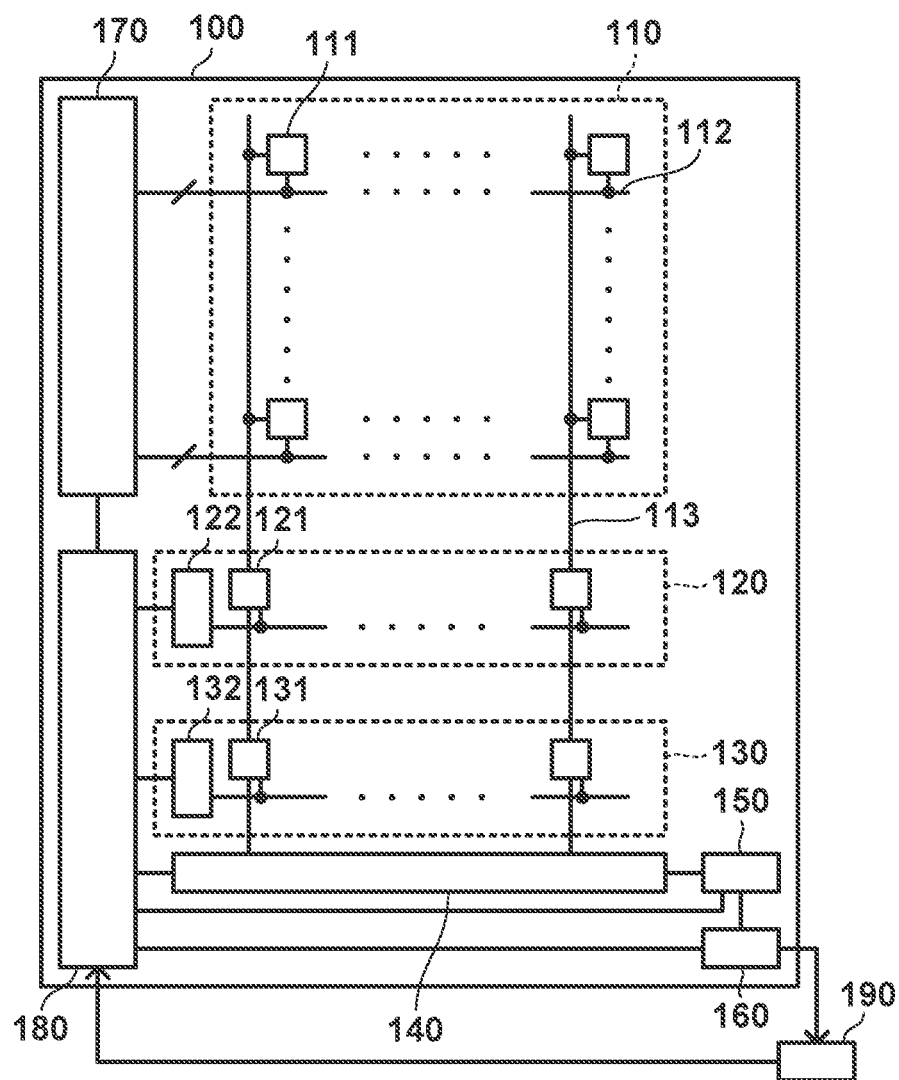
FIG. 8 is a view for explaining an example of the arrangement of a photoelectric conversion apparatus 100 according to some embodiments.

An example of the arrangement of the photoelectric conversion apparatus 100 according to some embodiments will be described with reference to a block diagram shown in FIG. 8. In the example shown in FIG. 8, the photoelectric conversion apparatus 100 includes a pixel unit 110, a readout unit 120, an A/D conversion unit 130, a horizontal scanning circuit 140, a signal processing circuit 150, an output circuit 160, a vertical scanning circuit 170, and a timing control circuit 180.

The pixel unit 110 includes a plurality of pixel circuits 111 arrayed in a two-dimensional array, a plurality of driving lines 112 provided for pixel rows, respectively, and a plurality of signal lines 113 provided for pixel columns, respectively. The pixel row indicates the plurality of pixel circuits 111 arranged in the horizontal direction in FIG. 8. The pixel column indicates the plurality of pixel circuits 111 arranged in the vertical direction in FIG. 8.

The pixel circuit 111 converts incident light into an electrical signal. Therefore, the pixel circuit 111 can also called a light receiving circuit. A control signal is supplied from the vertical scanning circuit 170 to each of the plurality of pixel circuits 111 via a corresponding one of the driving line 112. The readout unit 120 reads out, via a corresponding one of the signal lines 113, the electrical signal from the pixel circuit 111 supplied with the control signal of an active level.

The readout unit 120 includes a plurality of readout circuits 121 provided for the signal lines 113, respectively, and a control circuit 122 for controlling the operations of the readout circuits 121. Each readout circuit 121 reads out an analog signal corresponding to the electrical signal generated by the pixel circuit 111, and supplies it to the A/D conversion unit 130.

The A/D conversion unit 130 includes a plurality of A/D converters 131 provided for the signal lines 113, respectively, and a control circuit 132 for controlling the operations of the A/D converters 131. Each A/D converter 131 converts, into a digital signal, the analog signal supplied from the readout circuit 121. In the following description, each A/D converter 131 is a $\Delta\Sigma$ A/D converter.

The horizontal scanning circuit 140 sequentially reads out the digital signals from the plurality of A/D converters 131, and supplies them to the signal processing circuit 150. The photoelectric conversion apparatus 100 may include, between the A/D conversion unit 130 and the horizontal scanning circuit 140, a memory circuit for storing the digital signals. The signal processing circuit 150 processes the digital signal corresponding to the electrical signal generated in each pixel circuit 111. The signal processing circuit 150 may perform, for example, correction processing, complement processing, or the like for the digital signal.

The digital signal processed by the signal processing circuit 150 is output from the output circuit 160 to an external apparatus 190 outside the photoelectric conversion apparatus 100. The external apparatus 190 may be, for example, a control apparatus of an equipment incorporating the photoelectric conversion apparatus 100. The timing control circuit 180 controls the overall operation of the photoelectric conversion apparatus 100 by supplying a control signal to each circuit of the photoelectric conversion apparatus 100. For example, the timing control circuit 180 may change the driving mode of the photoelectric conversion apparatus 100 in accordance with an instruction from the external apparatus 190. The timing control circuit 180 changes the gain of the photoelectric conversion apparatus 100 in accordance with the change of the driving mode of the photoelectric conversion apparatus 100. A detailed example of a gain change method will be described later. The change of the driving mode may include a change between a still image capturing mode and a moving image capturing mode of shooting using the photoelectric conversion apparatus 100. The change of the driving mode may include a change of the sensitivity of shooting using the photoelectric conversion apparatus 100. The change of the driving mode may include a change of the resolution of A/D conversion by the A/D converter 131. The change of the driving mode may include a change of the frame rate of moving image capturing using the photoelectric conversion apparatus 100. The change of the driving mode may include at least one of the above examples.

Figure 9:
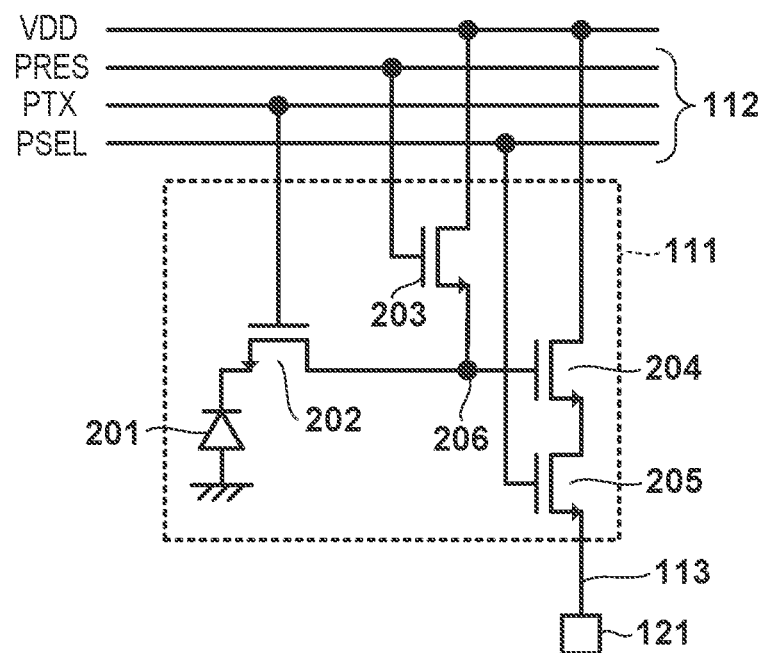
FIG. 9 is a circuit diagram for explaining an example of the circuit arrangement of a pixel circuit 111 according to some embodiments.

A detailed example of the circuit arrangement of the pixel circuit 111 will be described with reference to a circuit diagram shown in FIG. 9. The pixel circuit 111 can have an arbitrary arrangement for converting incident light into an electrical signal. An example will be described with reference to FIG. 9 but the pixel circuit 111 may have another arrangement.

In the example described with reference to FIG. 9, the pixel circuit 111 includes a photoelectric conversion element 201, a transfer transistor 202, a reset transistor 203, an amplification transistor 204, and a selection transistor 205. In the example shown in FIG. 9, the pixel unit 110 includes the three driving lines 112 for each pixel row, which supply control signals PRES, PTX, and PSEL to the pixel circuit 111, respectively.

The photoelectric conversion element 201 converts incident light into charges, and accumulates them. The photoelectric conversion element 201 may be, for example, a photodiode or a phototransistor. The photoelectric conversion element 201 may be a CMOS (Complementary Metal Oxide Semiconductor) sensor. Alternatively, the photoelectric conversion element 201 may be a SPAD (Single Photon Avalanche Diode) sensor.

The photoelectric conversion element 201 is connected to a floating diffusion 206 via the transfer transistor 202. The vertical scanning circuit 170 supplies the control signal PTX to the gate of the transfer transistor 202. When the control signal PTX is set to the active level, the transfer transistor 202 is set in a conductive state. The signal charges accumulated in the photoelectric conversion element 201 are accordingly transferred to the floating diffusion 206.

The floating diffusion 206 is also connected to the gate of the amplification transistor 204. One main electrode of the amplification transistor 204 is connected to the signal line 113 via the selection transistor 205. The other main electrode of the amplification transistor 204 is connected to a power supply potential VDD. The vertical scanning circuit 170 supplies the control signal PSEL to the gate of the selection transistor 205. When the control signal PSEL is set to the active level, the selection transistor 205 is set in the conductive state. The one main electrode of the amplification transistor 204 is accordingly connected to the current source of the readout circuit 121. This causes the amplification transistor 204 to operate as a source follower, and a signal corresponding to the potential of the floating diffusion 206 is read out into the signal line 113.

The reset transistor 203 is connected between the floating diffusion 206 and the power supply potential VDD. The vertical scanning circuit 170 supplies the control signal PRES to the gate of the reset transistor 203. When the control signal PRES is set to the active level, the reset transistor 203 is set in the conductive state. The potential of the floating diffusion 206 is accordingly reset to the power supply potential VDD.

Figure 10:
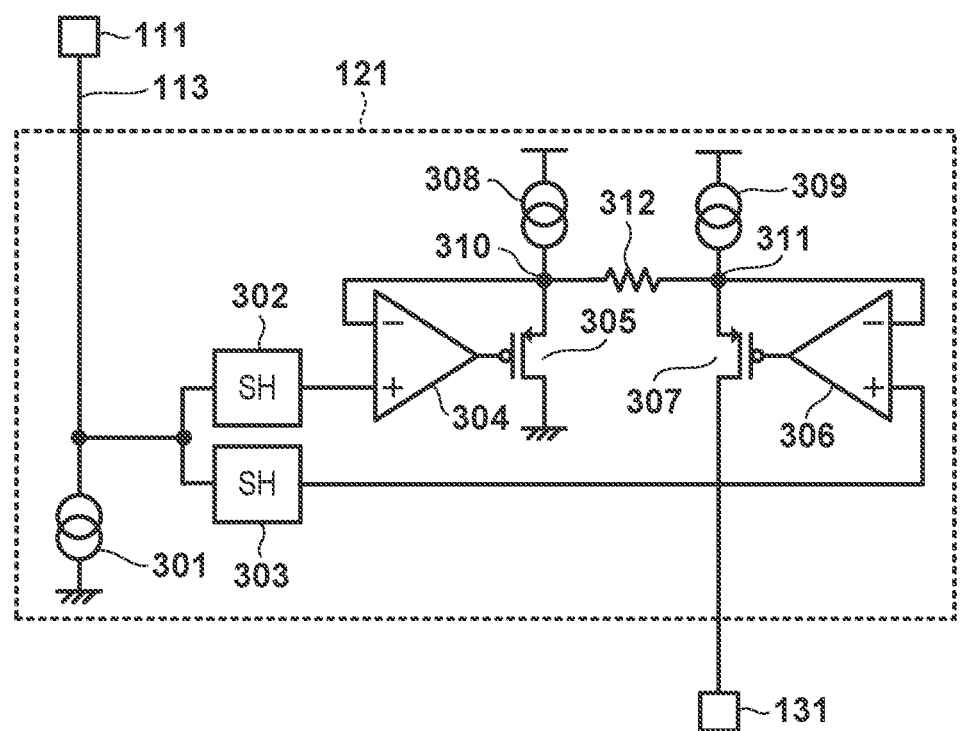
FIG. 10 is a circuit diagram for explaining an example of the circuit arrangement of a readout circuit 121 according to some embodiments.

A detailed example of the circuit arrangement of the readout circuit 121 will be described with reference to a circuit diagram shown in FIG. 10. The readout circuit 121 can have an arbitrary arrangement for reading out the electrical signal generated in the pixel circuit 111. An example will be described with reference to FIG. 10 but the readout circuit 121 may have another arrangement.

In the example described with reference to FIG. 10, the readout circuit 121 includes current sources 301, 308, and 309, sample-and-hold circuits 302 and 303, amplifiers 304 and 306, transistors 305 and 307, and a resistor 312.

The current source 301 supplies a bias current to the pixel circuit 111 (more specifically, the amplification transistor 204). Each of the sample-and-hold circuits 302 and 303 holds an output voltage from the pixel circuit 111. The timing control circuit 180 controls the pixel circuit 111 to output each of an electrical signal (to be referred to as a noise signal hereinafter) when the photoelectric conversion element 201 is in a reset state and an electrical signal (to be referred to as a data signal hereinafter) corresponding to incident light. In accordance with an instruction from the timing control circuit 180, the control circuit 122 controls the readout circuit 121 to read out the noise signal and hold it in the sample-and-hold circuit 302. Furthermore, in accordance with an instruction from the timing control circuit 180, the control circuit 122 controls the readout circuit 121 to read out the data signal from the pixel circuit 111 and hold it in the sample-and-hold circuit 303.

The amplifier 304 and the transistor 305 function as a source follower. The current source 308 supplies a bias current to the source follower. The potential of a node 310 between the current source 308 and the transistor 305 has a value corresponding to the voltage (noise signal) held in the sample-and-hold circuit 302.

The amplifier 306 and the transistor 307 function as a source follower. The current source 309 supplies a bias current to the source follower. The potential of a node 311 between the current source 309 and the transistor 307 has a value corresponding to the voltage (data signal) held in the sample-and-hold circuit 303.

The resistor 312 is connected between the nodes 310 and 311. Therefore, a voltage applied to the resistor 312 is a potential difference between the nodes 310 and 311. Thus, the readout circuit 121 supplies an analog current signal corresponding to the difference between the data signal and the noise signal to the A/D converter 131. The readout circuit 121 has a function of performing correlated double sampling (CDS).

A detailed example of the circuit arrangement of the A/D converter 131 will be described with reference to each of block diagrams shown in FIGS. 11A and 11B. The A/D converter 131 is a ΔΣ A/D converter. The A/D converter 131 converts the input analog signal into a digital signal. The A/D converter 131 shown in FIG. 11A includes a first-order ΔΣ modulator 404 and a decimation filter 405. The A/D converter 131 shown in FIG. 11B includes a second-order ΔΣ modulator 407 and the decimation filter 405. Alternatively, the A/D converter 131 may include a third- or higher-order ΔΣ modulator. By using a high-order ΔΣ modulator, the noise shaping effect improves. Each of the ΔΣ modulators 404 and 407 converts the input analog signal into a 1-bit digital signal string. The decimation filter 405 performs decimation processing (thinning processing) for the 1-bit digital signal string.

For example, the decimation filter 405 generates a digital signal corresponding to the ratio of a time during which 1 is obtained in the 1-bit digital signal string with respect to a predetermined time length. The ΔΣ modulator 404 may convert the input analog signal into a digital signal string of two or more bits.

Figure 11A:
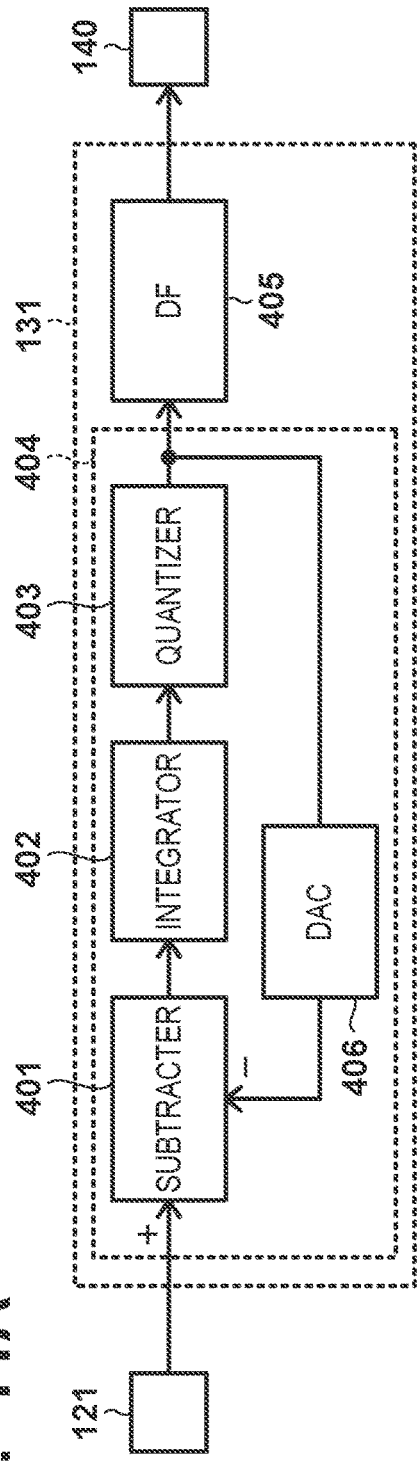
FIGS. 11A and 11B are views each for explaining an example of the circuit arrangement of an A/D converter 131 according to some embodiments.

As shown in FIG. 11A, the first-order ΔΣ modulator 404 includes a subtracter 401, an integrator 402, a quantizer 403, and a D/A converter (DAC) 406. An input (that is, the analog signal from the readout circuit 121) to the A/D converter 131 is supplied to the subtracter 401. Furthermore, the analog signal of the D/A converter 406 is supplied to the subtracter 401.

The subtracter 401 supplies, to the integrator 402, the difference between the analog signal from the readout circuit 121 and that from the D/A converter 406.

The integrator 402 integrates the output from the subtracter 401. The quantizer 403 quantizes the integration result of the integrator 402. For example, the quantizer 403 generates a 1-bit digital signal string based on the integration result, and supplies it to the decimation filter 405. The output from the quantizer 403 is output from the ΔΣ modulator 404.

The output from the quantizer 403 is also supplied to the D/A converter 406. The D/A converter 406 generates a signal corresponding to the output from the quantizer 403, and supplies it to the subtracter 401. The signal supplied from the D/A converter 406 to the subtracter 401 is subtracted from the analog signal supplied from the readout circuit 121, as described above.

Figure 11B:
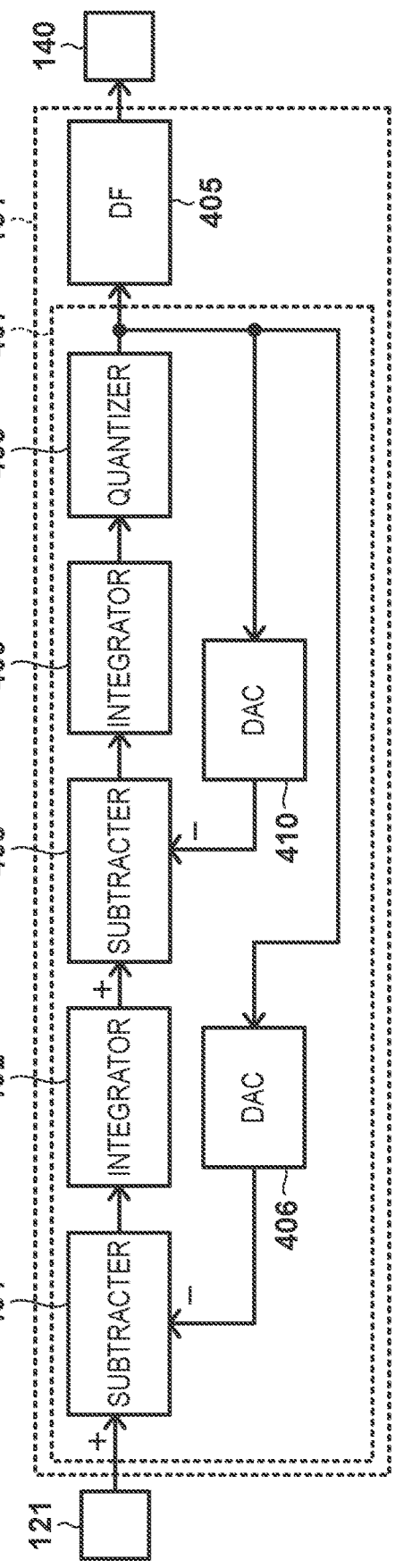

As shown in FIG. 11B, the second-order ΔΣ modulator 407 includes the subtracter 401, a subtracter 408, the integrator 402, an integrator 409, the quantizer 403, the D/A converter (DAC) 406, and a D/A converter (DAC) 410. The arrangements of the subtracter 401, the integrator 402, the quantizer 403, and the D/A converter (DAC) 406 are the same as those in the first-order ΔΣ modulator 404.

An output from the integrator 402 is supplied to the subtracter 408. Furthermore, the analog signal of the D/A converter 410 is supplied to the subtracter 408. The subtracter 408 supplies, to the integrator 409, the difference between the analog signal from the integrator 402 and that from the D/A converter 410. The integrator 409 integrates the output from the subtracter 408. The quantizer 403 quantizes the integration result of the integrator 409.

The output from the quantizer 403 is also supplied to the D/A converter 410. The D/A converter 410 generates a signal corresponding to the output from the quantizer 403, and supplies it to the subtracter 408. The signal supplied from the D/A converter 410 to the subtracter 408 is subtracted from the analog signal supplied from the integrator 402, as described above.

Figure 12A:
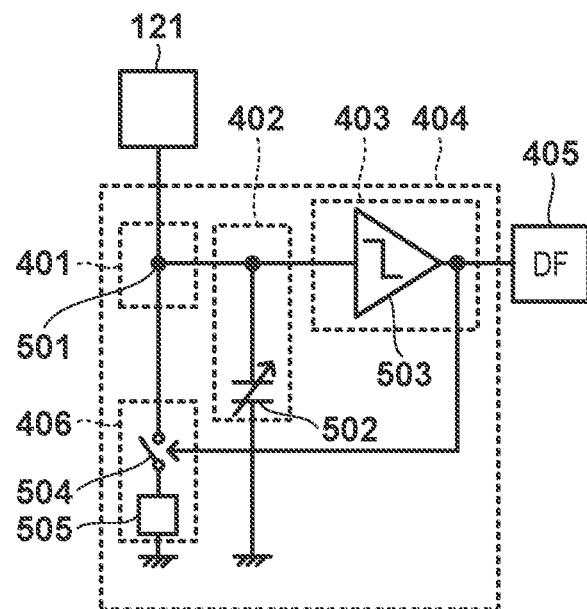
FIGS. 12A and 12B are circuit diagrams each for explaining an example of the circuit arrangement of a ΔΣ modulator according to some embodiments.
Figure 12B:
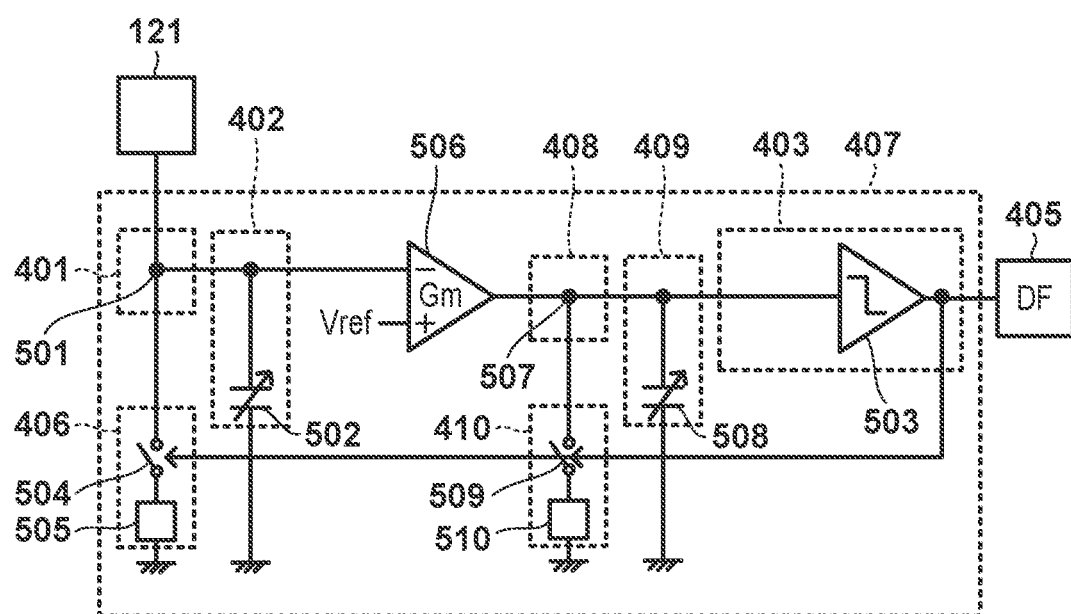

Examples of the circuit arrangements of the ΔΣ modulators 404 and 407 when the input to the A/D converter 131 is an analog current signal will be described with reference to FIGS. 12A and 12B, respectively. FIG. 12A shows the example of the circuit arrangement of the first-order ΔΣ modulator 404 and FIG. 12B shows the example of the circuit arrangement of the second-order ΔΣ modulator 407.

The example of the circuit arrangement of the first-order ΔΣ modulator 404 will first be described. The subtracter 401 is formed by a node 501 that is connected to the readout circuit 121, the D/A converter 406, and the integrator 402. The analog current from the D/A converter 406 is subtracted from the analog current signal supplied from the readout circuit 121 to the node 501, and the resultant current is supplied to the integrator 402.

The integrator 402 is formed by a capacitor 502. The capacitor 502 may be a variable capacitor whose capacitance value changes in accordance with an instruction from the control circuit 132. The capacitor 502 is charged with the output from the subtracter 401 so as to integrate the output. The voltage of the capacitor 502 is supplied to the quantizer 403. The quantizer 403 is formed by a comparator 503. The comparator 503 outputs a voltage of high or low level in accordance with the value of the voltage supplied from the integrator 402.

The D/A converter 406 is formed by a switch element 504 and a current generation circuit 505. The current generation circuit 505 generates an analog current to be supplied to the subtracter 401. The switch element 504 is located on a signal path between the subtracter 401 and the current generation circuit 505. ON/OFF of the switch element 504 is switched by the output from the quantizer 403. If the output from the quantizer 403 is at high level, the switch element 504 is turned on, thereby supplying the current from the current generation circuit 505 to the subtracter 401. On the other hand, if the output from the quantizer 403 is at low level, the switch element 504 is turned off, thereby supplying no current from the current generation circuit 505 to the subtracter 401. In this way, the value of the analog current supplied from the D/A converter 406 to the subtracter 401 changes in accordance with the output from the quantizer 403.

Next, the example of the circuit arrangement of the second-order ΔΣ modulator 407 will be described. The ΔΣ modulator 407 includes the subtracters 401 and 408, the integrators 402 and 409, a Gm amplifier 506, the quantizer 403, and the D/A converters 406 and 410. The circuit arrangements of the subtracter 401, the integrator 402, the quantizer 403, and the D/A converter 406 are the same as those in the first-order ΔΣ modulator 404. The Gm amplifier 506 is an amplifier, and converts an analog voltage signal supplied from the integrator 402 into an analog current signal and supplies it to the subtracter 408. The integrator 402 supplies the analog voltage signal to the inverting input terminal of the Gm amplifier 506, and the control circuit 132 supplies a reference voltage Vref to the non-inverting input terminal of the Gm amplifier 506.

The subtracter 408 is formed by a node 507 that is connected to the Gm amplifier 506, the D/A converter 410, and the integrator 409. An analog current from the D/A converter 410 is subtracted from the analog current signal supplied from the Gm amplifier 506 to the node 507, and the resultant current is supplied to the integrator 409. The integrator 409 is formed by a capacitor 508. The capacitor 508 may be a variable capacitor whose capacitance value changes in accordance with an instruction from the control circuit 132. The capacitor 508 is charged with the output from the Gm amplifier 506 so as to integrate the output. The voltage of the capacitor 508 is supplied to the quantizer 403.

The D/A converter 410 is formed by a switch element 509 and a current generation circuit 510. The current generation circuit 510 generates an analog current to be supplied to the subtracter 408. The switch element 509 is located on a signal path between the subtracter 408 and the current generation circuit 510. ON/OFF of the switch element 509 is switched by the output from the quantizer 403. If the output from the quantizer 403 is at high level, the switch element 509 is turned on, thereby supplying the current from the current generation circuit 510 to the subtracter 408. On the other hand, if the output from the quantizer 403 is at low level, the switch element 509 is turned off, thereby supplying no current from the current generation circuit 510 to the subtracter 408. In this way, the value of the analog current supplied from the D/A converter 416 to the subtracter 408 changes in accordance with the output from the quantizer 403.

Figure 13:
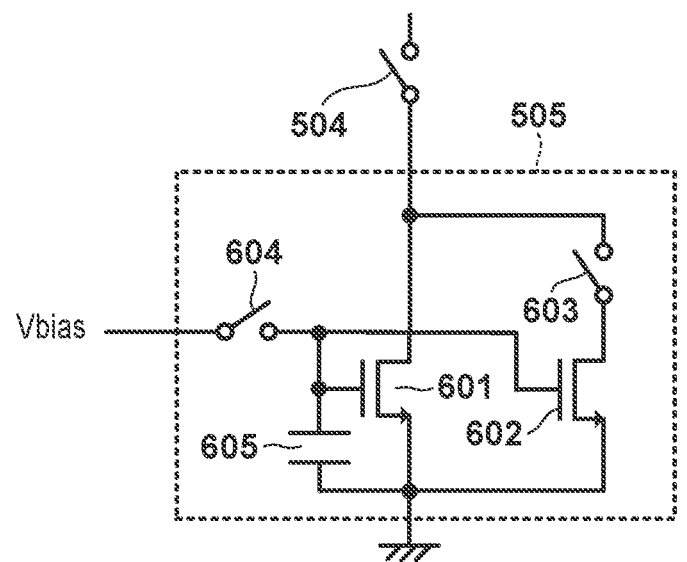
FIG. 13 is a circuit diagram for explaining an example of the circuit arrangement of a current generation circuit according to some embodiments.

A detailed example of the circuit arrangement of the current generation circuit 505 will be described with reference to a circuit diagram shown in FIG. 13. The current generation circuit 505 can have an arbitrary arrangement capable of changing a current amount to be generated. An example will be described with reference to FIG. 13 but the current generation circuit 505 may have another arrangement. The current generation circuit 510 may have the same circuit arrangement as that of the current generation circuit 505.

The current generation circuit 505 includes transistors 601 and 602, switch elements 603 and 604, and a capacitor 605. The transistor 601 is connected between the switch element 504 and ground. The transistor 602 and the switch element 603 are connected in series between the switch element 504 and ground. The control circuit 132 supplies a bias voltage Vbias to the gates of the transistors 601 and 602 via the switch element 604. The bias voltage Vbias is also supplied to the capacitor 605.

The switch element 604 and the capacitor 605 form a sample-and-hold circuit. When the switch element 604 is turned off, the bias voltage Vbias held in the capacitor 605 is supplied to the gates of the transistors 601 and 602.

Each of the transistors 601 and 602 functions as a current source that generates a current corresponding to the bias voltage Vbias supplied to the gate. The current generated by the transistor 601 is supplied to the switch element 504. The current generated by the transistor 602 is supplied to the switch element 504 when the switch element 603 is ON. The current generated by the transistor 602 is not supplied to the switch element 504 when the switch element 603 is OFF. ON/OFF of each of the switch elements 603 and 604 is controlled by a control signal supplied from the control circuit 132.

As described above, the value of the analog current supplied from the current generation circuit 505 to the switch element 504 changes in accordance with ON/OFF of the switch element 603. More specifically, when the switch element 603 is ON, a current of a larger value is supplied, as compared with a case in which the switch element 603 is OFF. By changing the value of the bias voltage Vbias, the current value generated by each of the transistors 601 and 602 can also be changed. By providing the current generation circuit 505, the D/A converter 406 can change the value of the analog current supplied from the D/A converter 406 to the subtracter 401 with respect to the same output (at high level in the above example) from the quantizer 403.

Figure 14:
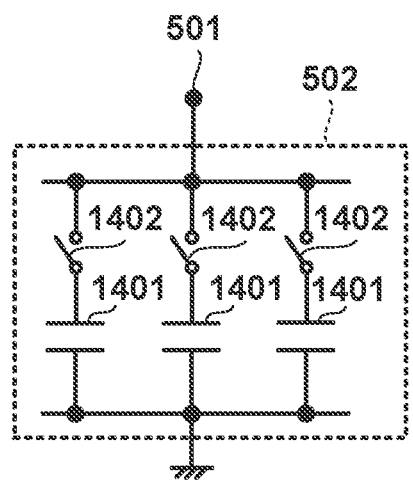
FIG. 14 is a circuit diagram for explaining an example of the circuit arrangement of a variable capacitor according to some embodiments.

A detailed example of the circuit arrangement of the capacitor 502 will be described with reference to a circuit diagram shown in FIG. 14. The capacitor 502 can have an arbitrary arrangement capable of changing the capacitance value. An example will be described with reference to FIG. 14 but the capacitor 502 may have another arrangement. The capacitor 508 may have the same arrangement as that of the capacitor 502.

The capacitor 502 includes a plurality of sets of unit capacitors 1401 and switch elements 1402 connected in series between the node 501 and ground. FIG. 14 shows three sets of the unit capacitors 1401 and the switch elements 1402 but the present invention is not limited to this. In the example shown in FIG. 14, the switch elements 1402 are connected on the side of the node 501 but may be connected on the side of ground.

The plurality of unit capacitors 1401 have equal capacitance values. ON/OFF of each switch element 1402 is controlled by a control signal supplied from the control circuit 132. The control circuit 132 sets the capacitance value of the capacitor 502 by controlling the number of switch elements 1402 that are turned on at the same time.

A method of changing the setting of the A/D converter 131 described above will be explained. In the first-order ΔΣ modulator 404 shown in FIG. 11A, the control circuit 132 can change the capacitance value of at least one of the capacitors 502 and 508. A case in which the capacitance value of the capacitor 502 is changed will be described below. By increasing the capacitance value of the capacitor 502, the time taken to charge the capacitor 502 is prolonged. As a result, the inversion frequency of the output of the quantizer 403 decreases, and the gain of the A/D converter 131 decreases. Conversely, by decreasing the capacitance value of the capacitor 502, the time taken to charge the capacitor 502 is shortened. As a result, the inversion frequency of the output of the quantizer 403 increases, and the gain of the A/D converter 131 increases. In this way, it is possible to adjust the driving timing of the A/D converter 131, the range of an input signal, and the gain by making the capacitance value of the capacitor 502 variable, thereby optimizing the AD conversion setting. For example, when a shooting target is an object of a low luminance, the control circuit 132 may decrease the capacitance value of the capacitor 502, as compared with a case in which a shooting target is an object of a high luminance. This can ensure a sufficient inversion frequency of the output of the quantizer 403.

The control circuit 132 may change the value of the analog current supplied from the D/A converter 406 to the subtracter 401 with respect to the same output from the quantizer 403 in synchronism with the change of the capacitance value of the capacitor 502. Changing the value of the analog current supplied from the D/A converter 406 to the subtracter 401 may include changing the number of transistors connected to the subtracter 401 among the plurality of transistors 601 and 602, as described above. Instead of or in addition to this, changing the value of the analog current supplied from the D/A converter 406 to the subtracter 401 may include changing the value of the voltage Vbias supplied to each of the gates of the transistors 601 and 602. It is possible to change the current more finely by changing the value of the voltage Vbias, as compared with a case in which the number of transistors is changed.

If the control circuit 132 increases the capacitance value of the capacitor 502, it may decrease the value of the analog current supplied from the D/A converter 406 to the subtracter 401. Conversely, if the control circuit 132 decreases the capacitance value of the capacitor 502, it may increase the value of the analog current supplied from the D/A converter 406 to the subtracter 401. By performing control in this way, the control circuit 132 can appropriately adjust an operation point at the start of integration of the integrator 402. More specifically, the operation point at the start of integration of the integrator 402 can be made constant before and after the change of the capacitance value of the capacitor 502, thereby reducing variations caused by a difference in operation point.

Instead of or in addition to this, the control circuit 132 may include changing the setting of the decimation filter 405 in synchronism with the change of the capacitance value of the capacitor 502. The setting to be changed may be, for example, the constant of the decimation filter 405 or the frequency of the clock signal of the decimation filter 405. By synchronously performing control in this way, the control circuit 132 can appropriately adjust the setting of the A/D converter 131.

In the second-order ΔΣ modulator 407 shown in FIG. 11B, the control circuit 132 can change the gain of the photoelectric conversion apparatus 100 by changing the capacitance values of the capacitors 502 and 508. The control circuit 132 may change only the capacitance value of the capacitor 502, change only the capacitance value of the capacitor 508, or change both the capacitance values of the capacitors 502 and 508. The operation of the A/D converter 131 performed by changing the capacitor 508 is the same as that when the capacitor 502 is changed. If only one of the capacitance values of the capacitors 502 and 508 is changed, the capacitor that is not changed need not be a variable capacitor.

In synchronism with the change of the capacitance value of the capacitor 508, the control circuit 132 may change the value of the analog current supplied from the D/A converter 410 to the subtracter 408 with respect to the same output from the quantizer 403. Instead of or in addition to this, the control circuit 132 may include changing the setting of the decimation filter 405 in synchronism with the change of the capacitance value of the capacitor 508.

The control circuit 132 may be able to individually change the capacitance values of the capacitors 502 and 508. For example, the control circuit 132 may set different values as the capacitance values of the capacitors 502 and 508. For example, the control circuit 132 may adjust variations in circuit characteristics of the pixel circuit 111 and the readout circuit 121 by changing the capacitance value of the capacitor 502, and may adjust variations in characteristics of the A/D converter 131 by changing the capacitance value of the capacitor 508.

In the above-described embodiment, the readout circuit 121 performs correlated double sampling. Alternatively, each of the noise signal and the data signal may be supplied to the A/D converter 131 without performing correlated double sampling in the readout circuit 121. The A/D converter 131 A/D-converts each of the noise signal and the data signal. The signal processing circuit 150 may obtain the difference between the noise signal and the data signal after A/D conversion. This can reduce variations in characteristics of the A/D converter 131 for each pixel column.

The control circuit 132 may change the value of the capacitor 502 (and the value of the capacitor 508) between a case in which the A/D converter 131 A/D-converts the data signal and a case in which the A/D converter 131 A/D-converts the noise signal. The noise signal generally has a value smaller than that of the data signal. Thus, the control circuit 132 may make the capacitance value of the capacitor 502 when the A/D converter 131 A/D-converts the noise signal smaller than the capacitance value of the capacitor 502 when the A/D converter 131 A/D-converts the data signal. Thus, since the inversion count of the comparator 503 becomes large at the time of A/D conversion of the noise signal, it is possible to improve the noise shaping effect. If a different gain is set for each of A/D conversion of the data signal and that of the noise signal, the signal processing circuit 150 adjusts the difference in gain.

In the above-described embodiment, the photoelectric conversion apparatus 100 includes one A/D converter 131 for each pixel column. Alternatively, the photoelectric conversion apparatus 100 may include a common A/D converter 131 for a plurality of pixel columns.

Note that the first and second embodiments can be combined.

Alternatively, part of the first embodiment and part of the second embodiment can be combined. For example, an example of applying part of the second embodiment to the first embodiment will be described. The timing control circuit 180 according to the second embodiment changes the gain of the photoelectric conversion apparatus 100 in accordance with the change of the driving mode of the photoelectric conversion apparatus 100. To change the gain of the photoelectric conversion apparatus 100, the resistance value of the resistor 312 shown in FIG. 3 of the first embodiment may be changed. The change of the driving mode may include a change of the sensitivity of shooting using the photoelectric conversion apparatus 100. The change of the driving mode may include a change of the resolution of A/D conversion by the A/D converter 131. The change of the driving mode may include a change of the frame rate of moving image capturing using the photoelectric conversion apparatus 100. The change of the driving mode may include at least one of the above examples.

Figure 3:
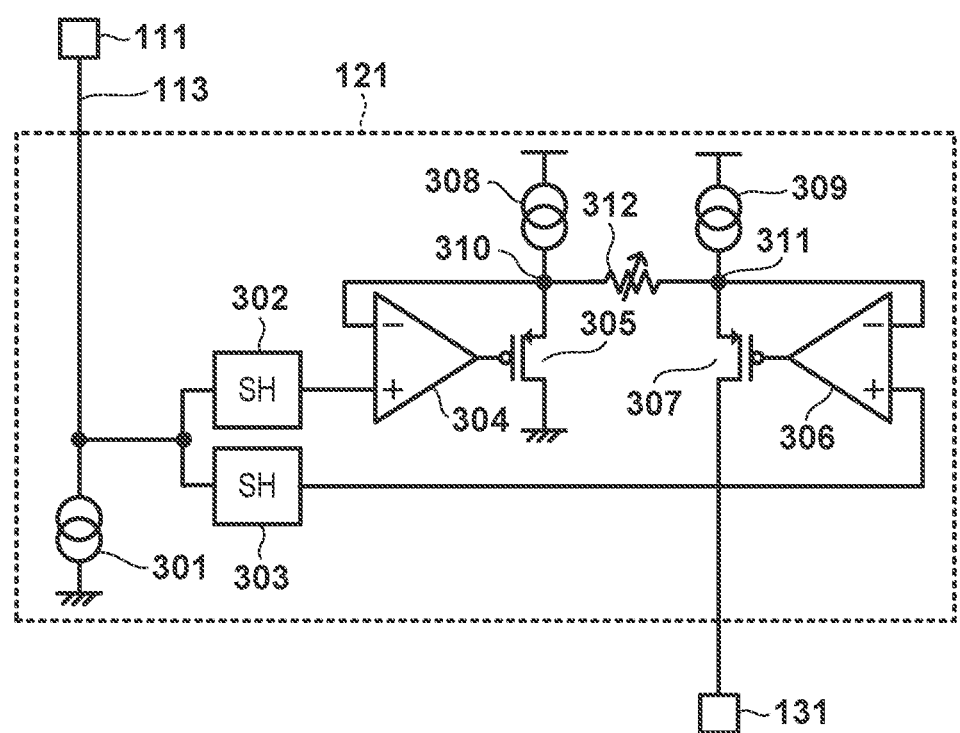
FIG. 3 is a circuit diagram for explaining an example of the circuit arrangement of a readout circuit 121 according to some embodiments.

In accordance with the change of the driving mode, the resistance value of the resistor 312 shown in FIG. 3 and the capacitance value of the capacitor 502 shown in FIG. 12A may be changed in combination. In accordance with the change of the driving mode, the resistance value of the resistor 312 shown in FIG. 3 and the capacitance values of the capacitors 502 and 508 shown in FIG. 12B may be changed in combination.

Other Embodiments

Figure 15A:
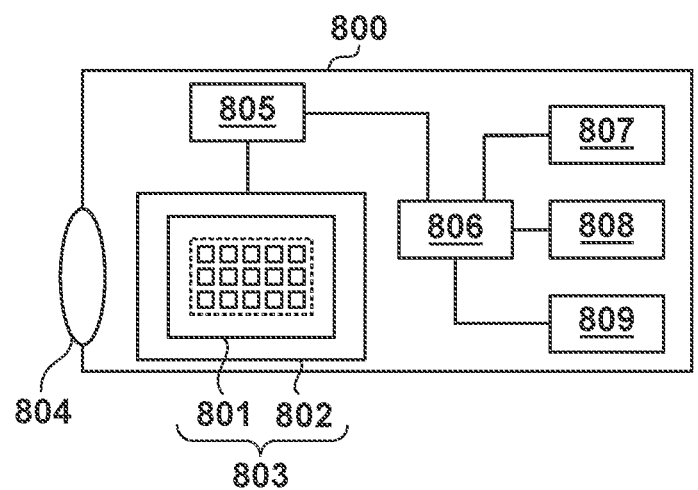
FIGS. 15A to 15C are views for explaining an example of the arrangement of an equipment according to some embodiments.

An embodiment of an equipment 800 including a semiconductor apparatus 803 will be described in detail with reference to FIG. 15A. The semiconductor apparatus 803 may be a photoelectric conversion apparatus according to any one of the above-described embodiments. The semiconductor apparatus 803 may include a semiconductor device 801 and a package 802 accommodating the semiconductor device 801. The package 802 may include a base on which the semiconductor device 801 is fixed and a cover made of glass or the like facing the semiconductor device 801. The package 802 may further include a connection member such as a bonding wire and bump for connecting a terminal of the base and a terminal (bonding pad) of the semiconductor device 801.

The equipment 800 may include at least one of an optical apparatus 804, a control apparatus 805, a processing apparatus 806, a display apparatus 807, a storage apparatus 808, and a mechanical apparatus 809. The optical apparatus 804 is implemented by, for example, a lens, a shutter, and a mirror. The optical apparatus 804 corresponds to the photoelectric conversion apparatus. The control apparatus 805 controls the semiconductor apparatus 803. The control apparatus 805 is, for example, a semiconductor apparatus such as an FPGA (Field Programmable Gate Array) or an ASIC (Application Specific Integrated Circuit).

The processing apparatus 806 processes a signal output from the semiconductor apparatus 803. The processing apparatus 806 is a semiconductor apparatus such as a CPU (Central Processing Unit) or an ASIC for forming an AFE (Analog Front End) or a DFE (Digital Front End). The display apparatus 807 is an EL (Electro-Luminescence) display apparatus or a liquid crystal display apparatus that displays information (image) obtained by the semiconductor apparatus 803. The storage apparatus 808 is a magnetic device or a semiconductor device that stores the information (image) obtained by the semiconductor apparatus 803. The storage apparatus 808 is a volatile memory such as an SRAM (Static Random Access Memory) or a DRAM (Dynamic Random Access Memory) or a nonvolatile memory such as a flash memory or a hard disk drive.

The mechanical apparatus 809 includes a moving or propulsion unit such as a motor or an engine. In the equipment 800, the mechanical apparatus 809 displays the signal output from the semiconductor apparatus 803 on the display apparatus 807 and performs external transmission by a communication apparatus (not shown) of the equipment 800. To do this, the equipment 800 may further include the storage apparatus 808 and the processing apparatus 806 in addition to the memory circuits and arithmetic circuits included in the semiconductor apparatus 803. The mechanical apparatus 809 may be controlled based on the signal output from the semiconductor apparatus 803.

In addition, the equipment 800 is suitable for an electronic equipment such as an information terminal (for example, a smartphone or a wearable terminal) which has a shooting function or a camera (for example, an interchangeable lens camera, a compact camera, a video camera, or a monitoring camera). The mechanical apparatus 809 in the camera may drive the components of the optical apparatus 804 in order to perform zooming, an in-focus operation, and a shutter operation. Alternatively, the mechanical apparatus 809 in the camera may move the semiconductor apparatus 803 in order to perform an anti-vibration operation.

Furthermore, the equipment 800 can be a transportation equipment such as a vehicle, a ship, or an airplane. The mechanical apparatus 809 in a transportation equipment can be used as a moving apparatus. The equipment 800 as a transportation equipment may be used as an equipment that transports the semiconductor apparatus 803 or an equipment that uses a shooting function to assist and/or automate driving (steering). The processing apparatus 806 for assisting and/or automating driving (steering) may perform, based on the information obtained by the semiconductor apparatus 803, processing for operating the mechanical apparatus 809 as a moving apparatus. Alternatively, the equipment 800 may be a medical equipment such as an endoscope, a measurement equipment such as an analysis distance measurement sensor, an analysis equipment such as an electron microscope, or an office equipment such as a copy machine.

Figure 15B:
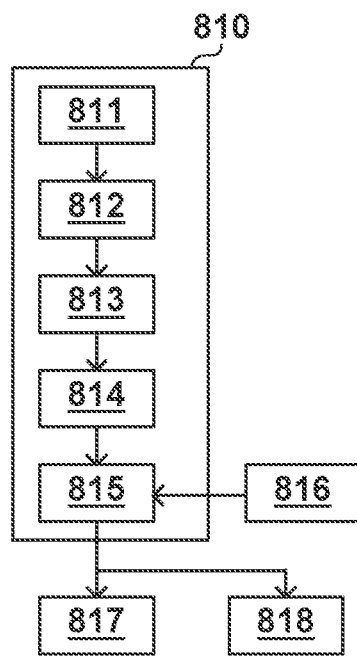

An embodiment of an image capturing system and a moving body will be described with reference to FIGS. 15B and 15C. FIG. 15B shows an example of an image capturing system 810 concerning an in-vehicle camera. The image capturing system 810 includes a photoelectric conversion apparatus 811. The photoelectric conversion apparatus 811 may be any one of the photoelectric conversion apparatuses described in the above embodiments. The image capturing system 810 includes an image processing unit 812 as a processing apparatus that performs image processing for a plurality of image data acquired by the photoelectric conversion apparatus 811. The image capturing system 810 also includes a parallax acquisition unit 813 as a processing apparatus that calculates a parallax (the phase difference of a parallax image) from the plurality of image data acquired by the photoelectric conversion apparatus 811. In addition, the image capturing system 810 includes a distance acquisition unit 814 as a processing apparatus that calculates the distance to a target object based on the calculated parallax, and a collision determination unit 815 as a processing apparatus that determines based on the calculated distance whether there is a collision possibility. In this example, the parallax acquisition unit 813 and the distance acquisition unit 814 are examples of an information acquisition unit that acquires information such as distance information to a target object. That is, the distance information is information about a parallax, a defocus amount, a distance to a target object, or the like. The collision determination unit 815 may determine the collision possibility using one of these pieces of distance information. Each of the above-described various kinds of processing apparatuses may be implemented by specially designed hardware or by general-purpose hardware for performing arithmetic processing based on a software module. Alternatively, each processing apparatus may be implemented by an FPGA, an ASIC, or the like or by a combination thereof.

The image capturing system 810 is connected to a vehicle information acquisition apparatus 816, and can acquire vehicle information such as a vehicle speed, a yaw rate, and a steering angle. The image capturing system 810 is connected to a control ECU 817 as a control apparatus that outputs a control signal to generate a braking force to the vehicle based on the determination result of the collision determination unit 815. That is, the control ECU 817 is an example of a moving body control unit that controls a moving body based on distance information. The image capturing system 810 is also connected to an alarming device 818 that generates an alarm to the driver based on the determination result of the collision determination unit 815. For example, if the collision possibility is high as the determination result of the collision determination unit 815, the control ECU 817 performs vehicle control to avoid a collision or reduce damage by, for example, applying the brake, returning the accelerator, or suppressing the engine output. The alarming device 818 warns the user by, for example, generating an alarm sound or the like, displaying alarming information on the screen of a car navigation system or the like, or giving a vibration to a seat belt or steering wheel.

In this embodiment, the image capturing system 810 captures the periphery, for example, the front or rear of the vehicle.

Figure 15C:
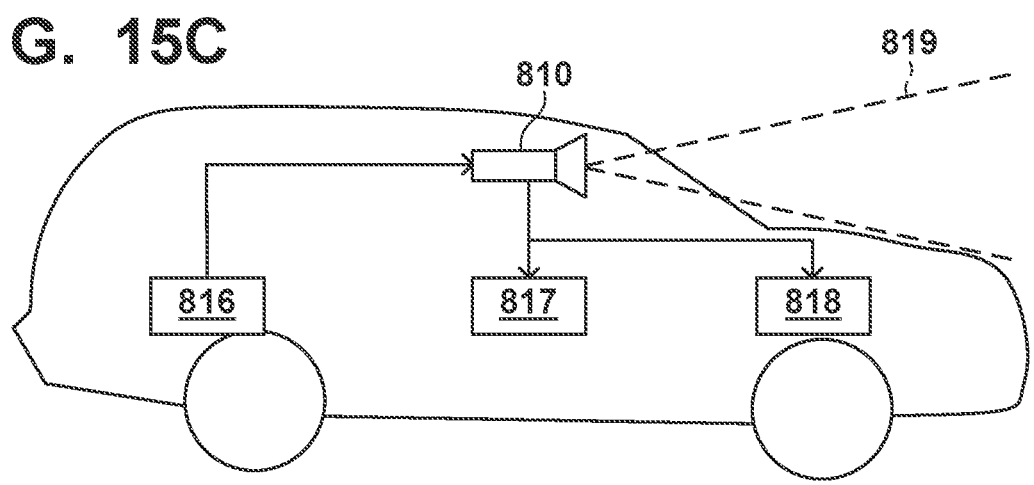

FIG. 15C shows the image capturing system 810 in a case in which the front of the vehicle (image capturing range 819) is captured. The vehicle information acquisition apparatus 816 sends an instruction to operate the image capturing system 810 and execute image capturing.

An example in which control is performed not to cause a collision against another vehicle has been described above. However, the image capturing system can also be applied to control for automated driving following another vehicle or automated driving without deviation from a lane. Furthermore, the image capturing system can be applied not only to a vehicle such as an automobile but also to, for example, a moving body (transportation equipment) such as a ship, an airplane, or an industrial robot. The moving apparatus in the moving body (transportation equipment) includes various kinds of moving units such as an engine, motor, wheels, and propellers.

In addition, the image capturing system can also be applied not only to the moving body but also to an equipment that widely uses object recognition, such as Intelligent Transport Systems (ITS).

The above-described embodiments can be changed appropriately without departing from the technical concept. Note that contents disclosed in this specification include not only contents described in this specification but also all items that can be grasped from this specification and its accompanying drawings. The contents disclosed in this specification include a complementary set of concepts described in this specification. That is, if, for example, "A is larger than B" is described in this specification, this specification is considered to disclose "A is not larger than B" even if a description of "A is not larger than B" is omitted. This is because if "A is larger than B" is described, it is assumed that a case in which "A is not larger than B" has been considered. To apprise the public of the scope of the present invention, the following claims are made.

With the above-described technique, it is possible to change the gain of the photoelectric conversion apparatus while suppressing an increase in chip size.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-016895 filed on Feb. 4, 2021 and Japanese Patent Application No. 2021-016896 filed on Feb. 4, 2021, which are hereby incorporated by reference herein in their entirety.

What is claimed is:

1. A photoelectric conversion apparatus comprising:
a light receiving circuit configured to convert light into an electrical signal;
a readout circuit configured to read out an analog signal corresponding to the electrical signal;
a $\Delta\Sigma$ A/D converter configured to convert the analog signal into a digital signal; and
a control circuit configured to change a gain of the photoelectric conversion apparatus in accordance with a change of a driving mode of the photoelectric conversion apparatus,
wherein the analog signal read out by the readout circuit is an analog current signal,
the readout circuit includes a variable resistor on a signal path for supplying the analog current signal to the $\Delta\Sigma$ A/D converter, and
the control circuit changes the gain of the photoelectric conversion apparatus by changing a resistance value of the variable resistor.

2. The apparatus according to claim 1, wherein
the $\Delta\Sigma$ A/D converter includes
a subtracter configured to be supplied with the analog current signal,
an integrator configured to integrate an output from the subtracter,
a quantizer configured to quantize an integration result of the integrator,
a decimation filter configured to perform decimation processing for an output from the quantizer, and
a D/A converter configured to supply, to the subtracter, an analog current corresponding to the output from the quantizer so as to be subtracted from the analog current signal, and
changing the setting of the $\Delta\Sigma$ A/D converter includes changing a value of the analog current supplied from the D/A converter to the subtracter with respect to the same output from the quantizer.

3. The apparatus according to claim 2, wherein
the integrator includes a variable capacitor configured to be charged with the output from the subtracter so as to integrate the output, and
the control circuit changes the gain of the photoelectric conversion apparatus by changing the resistance value of the variable resistor and changing a capacitance value of the variable capacitor.

4. The apparatus according to claim 2, wherein
the D/A converter includes a current generation circuit configured to generate an analog current to be supplied to the subtracter,
the current generation circuit includes a plurality of current sources, and changing the setting of the ΔΣ A/D converter includes changing the number of current sources connected to the subtracter among the plurality of current sources.

5. The apparatus according to claim 4, wherein
each of the plurality of current sources includes a transistor, and
changing the setting of the ΔΣ A/D converter includes changing a value of a voltage to be supplied to a gate of the transistor.

6. The apparatus according to claim 4, wherein
the subtracter, the integrator, the analog current signal, the analog current, and the D/A converter are a first subtracter, a first integrator, a first analog current signal, a first analog current, and a first D/A converter, respectively,
the ΔΣ A/D converter further includes
a second subtracter configured to be supplied with a second analog current signal from the first integrator,
a second integrator configured to integrate an output from the second subtracter,
an amplifier configured to convert an output from the second integrator into a current, and
a second D/A converter configured to supply, to the subtracter, a second analog current corresponding to the output from the quantizer so as to be subtracted from the second analog current signal, and
changing the setting of the ΔΣ A/D converter includes changing a value of a reference voltage supplied to the amplifier.

7. The apparatus according to claim 2, wherein
the subtracter, the integrator, the analog current signal, the analog current, and the D/A converter are a first subtracter, a first integrator, a first analog current signal, a first analog current, and a first D/A converter, respectively,
the ΔΣ A/D converter further includes
a second subtracter configured to be supplied with a second analog current signal from the first integrator,
a second integrator configured to integrate an output from the second subtracter,
an amplifier configured to convert an output from the second integrator into a current, and
a second D/A converter configured to supply, to the subtracter, a second analog current corresponding to the output from the quantizer so as to be subtracted from the second analog current signal, and
changing the setting of the ΔΣ A/D converter includes changing a value of a reference voltage supplied to the amplifier.

8. The apparatus according to claim 2, wherein changing the setting of the ΔΣ A/D converter includes changing a setting of the decimation filter.

9. The apparatus according to claim 1, wherein the change of the driving mode includes at least one of
a change between a still image capturing mode and a moving image capturing mode of shooting using the photoelectric conversion apparatus,
a change of sensitivity of shooting using the photoelectric conversion apparatus,
a change of a resolution of A/D conversion by the ΔΣ A/D converter, and
a change of a frame rate of moving image capturing using the photoelectric conversion apparatus.

10. An equipment comprising:
a photoelectric conversion apparatus defined in claim 1; and
at least one of an optical apparatus corresponding to the photoelectric conversion apparatus,
a control apparatus configured to control the photoelectric conversion apparatus,
a processing apparatus configured to process a signal output from the photoelectric conversion apparatus,
a display apparatus configured to display information obtained by the photoelectric conversion apparatus,
a storage apparatus configured to store the information obtained by the photoelectric conversion apparatus, and
a mechanical apparatus configured to operate based on the information obtained by the photoelectric conversion apparatus.

11. A photoelectric conversion apparatus comprising:
a light receiving circuit configured to convert light into an electrical signal;
a readout circuit configured to read out an analog signal corresponding to the electrical signal;
a ΔΣ A/D converter configured to convert the analog signal into a digital signal; and
a control circuit configured to change a gain of the photoelectric conversion apparatus in accordance with a change of a driving mode of the photoelectric conversion apparatus,
wherein the control circuit changes the gain of the photoelectric conversion apparatus by changing a setting of the ΔΣ A/D converter.

12. The apparatus according to claim 11, wherein
the analog signal read out by the readout circuit is an analog current signal,
the ΔΣ A/D converter includes
a subtracter configured to be supplied with the analog current signal,
an integrator configured to integrate an output from the subtracter,
a quantizer configured to quantize an integration result of the integrator,
a decimation filter configured to perform decimation processing for an output from the quantizer, and
a D/A converter configured to supply, to the subtracter, an analog current corresponding to the output from the quantizer so as to be subtracted from the analog current signal, and
changing the setting of the ΔΣ A/D converter includes changing a value of the analog current supplied from the D/A converter to the subtracter with respect to the same output from the quantizer.

13. The apparatus according to claim 12, wherein
the integrator includes a variable capacitor configured to be charged with the output from the subtracter so as to integrate the output, and
changing the setting of the ΔΣ A/D converter includes changing a capacitance value of the variable capacitor.

14. The apparatus according to claim 12, wherein
the D/A converter includes a current generation circuit configured to generate an analog current to be supplied to the subtracter,
the current generation circuit includes a plurality of current sources, and
changing the setting of the ΔΣ A/D converter includes changing the number of current sources connected to the subtracter among the plurality of current sources.

15. The apparatus according to claim 11, wherein
the analog signal read out by the readout circuit is an analog voltage signal,
the ΔΣ A/D converter includes a subtracter configured to be supplied with the analog voltage signal,
an integrator configured to integrate an output from the subtracter,
a quantizer configured to quantize an integration result of the integrator,
a decimation filter configured to perform decimation processing for an output from the quantizer, and
a D/A converter configured to supply, to the subtracter, an analog voltage corresponding to the output from the quantizer so as to be subtracted from the analog voltage signal, and
changing the setting of the ΔΣ A/D converter includes changing a value of the analog voltage supplied from the D/A converter to the subtracter with respect to the same output from the quantizer.

16. An equipment comprising:
a photoelectric conversion apparatus defined in claim 2; and
at least one of
an optical apparatus corresponding to the photoelectric conversion apparatus,
a control apparatus configured to control the photoelectric conversion apparatus,
a processing apparatus configured to process a signal output from the photoelectric conversion apparatus,
a display apparatus configured to display information obtained by the photoelectric conversion apparatus,
a storage apparatus configured to store the information obtained by the photoelectric conversion apparatus, and
a mechanical apparatus configured to operate based on the information obtained by the photoelectric conversion apparatus.

17. An A/D converter for converting an analog current signal into a digital signal, comprising:
a subtracter configured to be supplied with the analog current signal;
an integrator configured to integrate an output from the subtracter;
a quantizer configured to quantize an integration result of the integrator;
a decimation filter configured to perform decimation processing for an output from the quantizer; and
a D/A converter configured to supply, to the subtracter, an analog current corresponding to the output from the quantizer so as to be subtracted from the analog current signal,
wherein the D/A converter can change a value of the analog current supplied from the D/A converter to the subtracter with respect to the same output from the quantizer.

18. A photoelectric conversion apparatus comprising:
a light receiving circuit configured to convert light into an electrical signal;
a readout circuit configured to read out an analog current signal corresponding to the electrical signal;
a ΔΣ A/D converter configured to convert the analog current signal into a digital signal; and
a control circuit configured to change a setting of the ΔΣ A/D converter,
wherein the ΔΣ A/D converter includes
a subtracter configured to be supplied with the analog current signal,
an integrator configured to integrate an output from the subtracter,
a quantizer configured to quantize an integration result of the integrator,
a decimation filter configured to perform decimation processing for an output from the quantizer, and
a D/A converter configured to supply, to the subtracter, an analog current corresponding to the output from the quantizer so as to be subtracted from the analog current signal,
the integrator includes a variable capacitor configured to be charged with the output from the subtracter so as to integrate the output, and
changing the setting of the ΔΣ A/D converter includes changing a capacitance value of the variable capacitor.

19. The apparatus according to claim 18, wherein the control circuit changes a value of the analog current supplied from the D/A converter to the subtracter with respect to the same output from the quantizer in synchronism with the change of the capacitance value of the variable capacitor.

20. The apparatus according to claim 18, wherein the control circuit changes a setting of the decimation filter in synchronism with the change of the capacitance value of the variable capacitor.

21. The apparatus according to claim 18, wherein
the subtracter, the integrator, the analog current signal, the analog current, and the D/A converter are a first subtracter, a first integrator, a first analog current signal, a first analog current, and a first D/A converter, respectively, and
the ΔΣ A/D converter further includes
a second subtracter configured to be supplied with a second analog current signal from the first integrator,
a second integrator configured to integrate an output from the second subtracter, and
a second D/A converter configured to supply, to the subtracter, a second analog current corresponding to the output from the quantizer so as to be subtracted from the second analog current signal.

22. The apparatus according to claim 21, wherein
the variable capacitor is a first variable capacitor, and
the second integrator includes a second variable capacitor configured to be charged with the output from the second subtracter so as to integrate the output.

23. The apparatus according to claim 22, wherein the control circuit changes a value of the second analog current supplied from the second D/A converter to the second subtracter with respect to the same output from the quantizer in synchronism with the change of the capacitance value of the second variable capacitor.

24. The apparatus according to claim 23, wherein the control circuit changes a setting of the decimation filter in synchronism with the change of the capacitance value of the second variable capacitor.

25. The apparatus according to claim 24, further comprising a variable resistor on a signal path for supplying the analog current signal to the ΔΣ A/D converter,
wherein the control circuit changes a resistance value of the variable resistor.

26. The apparatus according to claim 23, further comprising a variable resistor on a signal path for supplying the analog current signal to the ΔΣ A/D converter,
wherein the control circuit changes a resistance value of the variable resistor.

27. The apparatus according to claim 22, wherein the control circuit can individually change a value of the first variable capacitor and a value of the second variable capacitor.

28. The apparatus according to claim 27, further comprising a variable resistor on a signal path for supplying the analog current signal to the ΔΣ A/D converter, wherein the control circuit changes a resistance value of the variable resistor.

29. The apparatus according to claim 22, further comprising a variable resistor on a signal path for supplying the analog current signal to the ΔΣ A/D converter,
wherein the control circuit changes a resistance value of the variable resistor.

30. The apparatus according to claim 21, further comprising a variable resistor on a signal path for supplying the analog current signal to the ΔΣ A/D converter,
wherein the control circuit changes a resistance value of the variable resistor.

31. The apparatus according to claim 18, further comprising a variable resistor on a signal path for supplying the analog current signal to the ΔΣ A/D converter,
wherein the control circuit changes a resistance value of the variable resistor.

32. The apparatus according to claim 18, wherein
the readout circuit reads out a noise signal from the light receiving circuit in a reset state,
the ΔΣ A/D converter further converts the noise signal into a digital signal, and
the control circuit changes the value of the variable capacitor between a case in which the ΔΣ A/D converter converts the analog current signal and a case in which the ΔΣ A/D converter converts a value of the noise signal.

33. The apparatus according to claim 32, wherein the capacitance value of the variable capacitor in the case in which the ΔΣ A/D converter converts the noise signal is smaller than the capacitance value of the variable capacitor in the case in which the ΔΣ A/D converter converts a value of the analog current signal.

34. An equipment comprising:
a photoelectric conversion apparatus defined in claim 18; and
at least one of
an optical apparatus corresponding to the photoelectric conversion apparatus,
a control apparatus configured to control the photoelectric conversion apparatus,
a processing apparatus configured to process a signal output from the photoelectric conversion apparatus,
a display apparatus configured to display information obtained by the photoelectric conversion apparatus,
a storage apparatus configured to store the information obtained by the photoelectric conversion apparatus, and
a mechanical apparatus configured to operate based on the information obtained by the photoelectric conversion apparatus.

* * * * *